US009040837B2

(12) United States Patent
Takahashi et al.

(10) Patent No.: US 9,040,837 B2
(45) Date of Patent: May 26, 2015

(54) WIRING BOARD AND METHOD FOR MANUFACTURING THE SAME

(71) Applicants: Michimasa Takahashi, Ogaki (JP); Teruyuki Ishihara, Ogaki (JP)

(72) Inventors: Michimasa Takahashi, Ogaki (JP); Teruyuki Ishihara, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 275 days.

(21) Appl. No.: 13/665,550

(22) Filed: Oct. 31, 2012

(65) Prior Publication Data
US 2013/0153269 A1    Jun. 20, 2013

Related U.S. Application Data

(60) Provisional application No. 61/570,505, filed on Dec. 14, 2011.

(51) Int. Cl.
| H05K 1/03 | (2006.01) |
| H05K 3/36 | (2006.01) |
| H05K 3/46 | (2006.01) |
| H05K 1/14 | (2006.01) |

(52) U.S. Cl.
CPC ............... *H05K 3/368* (2013.01); *Y10T 156/10* (2015.01); *H05K 1/141* (2013.01); *H05K 1/144* (2013.01); *H05K 3/4691* (2013.01)

(58) Field of Classification Search
CPC ............. H05K 1/00; H05K 1/11; H05K 1/09; H05K 1/183; H05K 3/00; H05K 3/10; H05K 3/20; H05K 3/30; H05K 3/36; H05K 3/46; H05K 3/4069; H05K 2203/061; H01L 21/00; H01L 21/44; H01L 21/56; H01L 23/48; H01L 23/488; H01L 29/41; H01L 29/84; H01J 1/62; H01J 1/70

USPC ......... 174/255, 250, 254, 256, 257, 260–262, 174/264; 257/88, 415, 738, 774, 786; 438/127, 612; 313/504, 512; 29/830
See application file for complete search history.

(56) References Cited

U.S. PATENT DOCUMENTS

| 5,315,072 A | * | 5/1994 | Arai et al. | 174/262 |
| 5,502,889 A | * | 4/1996 | Casson et al. | 29/830 |
| 6,281,446 B1 | * | 8/2001 | Sakamoto et al. | 174/255 |
| 6,395,993 B1 | * | 5/2002 | Nakamura et al. | 174/254 |
| 6,884,945 B2 | * | 4/2005 | Kim et al. | 174/262 |
| 7,094,678 B2 | * | 8/2006 | Bradley | 438/612 |

(Continued)

FOREIGN PATENT DOCUMENTS

JP    11-317582    11/1999

*Primary Examiner* — Xiaoliang Chen
(74) *Attorney, Agent, or Firm* — Oblon, McClelland, Maier & Neustadt, L.L.P.

(57) ABSTRACT

A wiring board includes a first multilayer wiring board having first conductive layers and having a surface, a second multilayer wiring board having second conductive layers and positioned such that the second multilayer wiring board has a surface facing the surface of the first multilayer wiring board, and an adhesive layer including an adhesive sheet and interposed between the first multilayer wiring board and the second multilayer wiring board such that the adhesive layer is adhering the first multilayer wiring board and the second multilayer wiring board. The first multilayer wiring board has a first pad on the surface of the first multilayer wiring board, the second multilayer wiring board has a second pad on the surface of the second multilayer wiring board, and the first pad and the second pad are positioned such that the first pad and the second pad face each other across the adhesive layer.

24 Claims, 37 Drawing Sheets

(56) References Cited

U.S. PATENT DOCUMENTS

| | | | |
|---|---|---|---|
| 8,729,709 B2* | 5/2014 | Baba et al. | 257/774 |
| 2002/0046880 A1* | 4/2002 | Takubo et al. | 174/261 |
| 2002/0189856 A1* | 12/2002 | Takenaka et al. | 174/255 |
| 2004/0035604 A1* | 2/2004 | Takenaka et al. | 174/255 |
| 2004/0207033 A1* | 10/2004 | Koshido | 257/415 |
| 2004/0232802 A1* | 11/2004 | Koshido | 310/348 |
| 2005/0023033 A1* | 2/2005 | Saiki et al. | 174/260 |
| 2006/0091485 A1* | 5/2006 | Koshido | 257/415 |
| 2007/0152349 A1* | 7/2007 | Chung et al. | 257/786 |
| 2007/0222072 A1* | 9/2007 | Chang et al. | 257/737 |
| 2007/0286252 A1* | 12/2007 | Ha et al. | 372/50.12 |
| 2008/0093118 A1* | 4/2008 | Takahashi et al. | 174/264 |
| 2008/0099230 A1* | 5/2008 | Takahashi et al. | 174/250 |
| 2008/0184555 A1* | 8/2008 | Machida | 29/830 |
| 2009/0261474 A1* | 10/2009 | Chung et al. | 257/738 |
| 2010/0018634 A1* | 1/2010 | Takahashi et al. | 156/150 |
| 2011/0031621 A1* | 2/2011 | Chung et al. | 257/738 |
| 2011/0220407 A1* | 9/2011 | Takahashi et al. | 174/377 |
| 2011/0244636 A1* | 10/2011 | Kondo | 438/127 |
| 2011/0303444 A1* | 12/2011 | Yoshimura | 174/257 |
| 2011/0303453 A1* | 12/2011 | Yoshimura et al. | 174/264 |
| 2011/0303454 A1* | 12/2011 | Yoshimura | 174/264 |
| 2011/0308079 A1* | 12/2011 | Takahashi et al. | 29/829 |
| 2011/0314668 A1* | 12/2011 | Ito et al. | 29/837 |
| 2012/0008290 A1* | 1/2012 | Takahashi et al. | 361/749 |
| 2012/0025700 A1* | 2/2012 | Ryu et al. | 313/512 |
| 2012/0104420 A1* | 5/2012 | Lee et al. | 257/88 |
| 2012/0153814 A1* | 6/2012 | Lee et al. | 313/504 |
| 2012/0248579 A1* | 10/2012 | Endo | 257/621 |
| 2012/0248624 A1* | 10/2012 | Endo | 257/774 |

* cited by examiner

US 9,040,837 B2

WIRING BOARD AND METHOD FOR MANUFACTURING THE SAME

CROSS-REFERENCE TO RELATED APPLICATIONS

The present application is based upon and claims the benefit of priority from U.S. Application No. 61/570,505, filed Dec. 14, 2011, the entire contents of which are incorporated herein by reference

BACKGROUND OF THE INVENTION

1. Field of the Invention

The present invention relates to a wiring board and its manufacturing method.

2. Description of Background Art

In Japanese Laid-Open Patent Publication No. H11-317582, a multilayer wiring board includes a first wiring board and a second wiring board having more conductive layers than the first wiring board. A partial section of such a multilayer wiring board has more conductive layers than the rest by embedding the second wiring board (carrier board) in a recessed section of the first wiring board (motherboard). The entire contents of Japanese Laid-Open Patent Publication No. H11-317582 are incorporated herein in this application.

SUMMARY OF THE INVENTION

According to one aspect of the present invention, a wiring board includes a first multilayer wiring board having first conductive layers and having a surface, a second multilayer wiring board having second conductive layers and positioned such that the second multilayer wiring board has a surface facing the surface of the first multilayer wiring board, and an adhesive layer including an adhesive sheet and interposed between the first multilayer wiring board and the second multilayer wiring board such that the adhesive layer is adhering the first multilayer wiring board and the second multilayer wiring board. The first multilayer wiring board has a first pad on the surface of the first multilayer wiring board, the second multilayer wiring board has a second pad on the surface of the second multilayer wiring board, and the first pad and the second pad are positioned such that the first pad and the second pad face each other across the adhesive layer.

According to another aspect of the present invention, a method for manufacturing a wiring board includes preparing a first multilayer wiring board including first conductive layers and having a first pad on a surface of the first multilayer wiring board, preparing a second multilayer wiring board including second conductive layers and having a second pad on a surface of the second multilayer wiring board, setting the surface of the first multilayer wiring board and the surface of the second multilayer wiring board such that the first pad and the second pad face each other, and interposing between the surface of the first multilayer wiring board and the surface of the second multilayer wiring board an adhesive layer including an adhesive sheet such that the first multilayer wiring board and the second multilayer wiring board are adhered through the adhesive layer and that the first pad and the second pad face each other across the adhesive layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
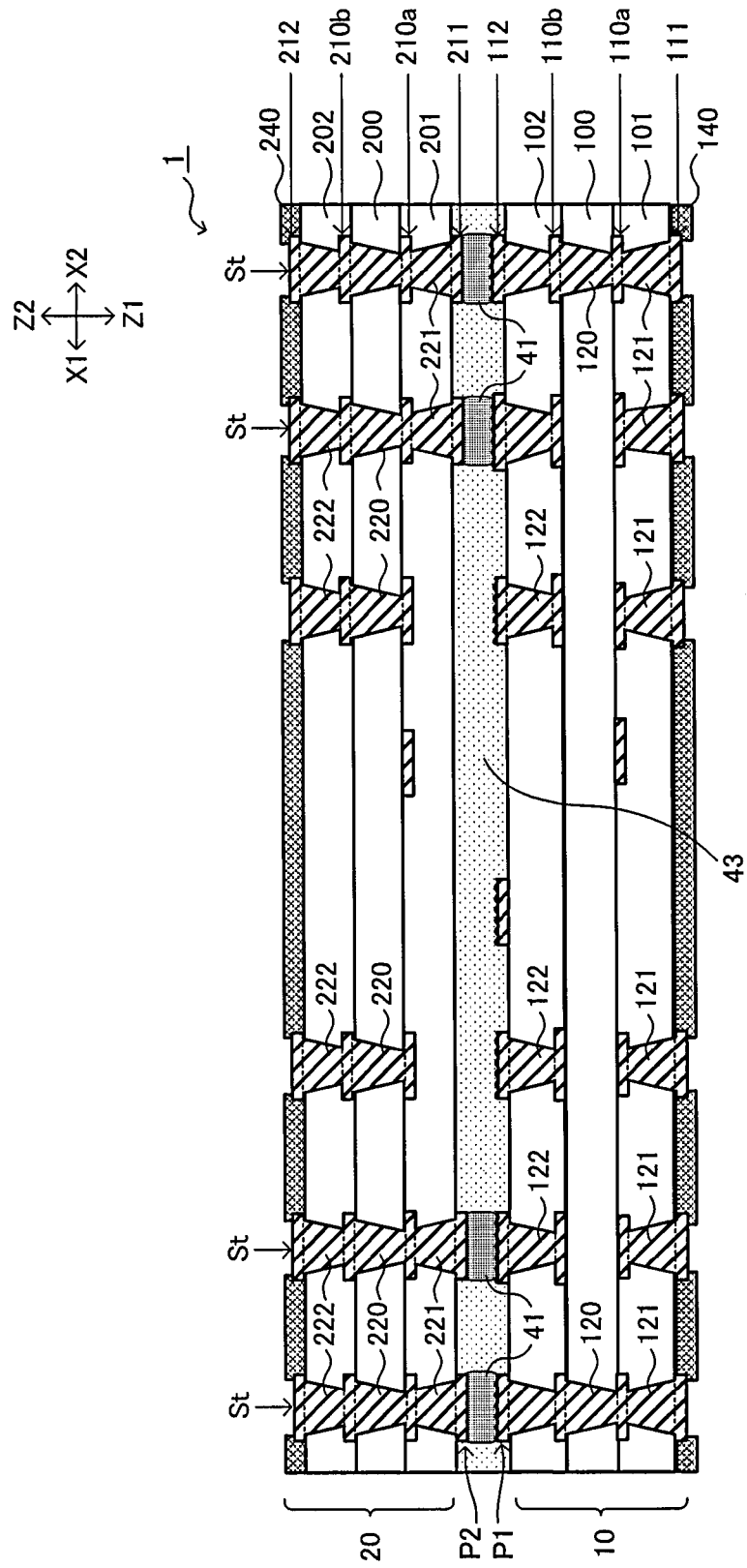
FIG. 1 is a cross-sectional view of a wiring board according to a first embodiment of the present invention.

The embodiments will now be described with reference to the accompanying drawings, wherein like reference numerals designate corresponding or identical elements throughout the various drawings.

Arrows (Z1, Z2) in the drawings each indicate a lamination direction of a wiring board (or a thickness direction of the wiring board) corresponding to a direction along a normal line to main surfaces (upper and lower surfaces) of the wiring board. On the other hand, arrows (X1, X2) and (Y1, Y2) each indicate a direction perpendicular to lamination directions (or a direction to a side of each layer). The main surfaces of the wiring board are on the X-Y plane. Side surfaces of the wiring board are on the X-Z plane or the Y-Z plane. Being "directly on" or "directly below" means direction Z (Z1 side or Z2 side). "Preparing" includes situations in which material and components are purchased and manufactured accordingly as well as situations in which finished products are purchased and used accordingly.

In lamination directions, a side closer to a core (substrates 100, 200, 300, 400, 500) is referred to as a lower layer, and a side farther from the core is referred to as an upper layer in the present embodiment.

A conductive layer is structured with one or multiple conductive patterns. A conductive layer may include a conductive pattern that forms an electrical circuit such as wiring (including ground), a pad, a land or the like, or may include a planar conductive pattern or the like that does not form an electrical circuit.

Opening portions include a cut, a notch or the like in addition to a hole and a groove. Holes are not limited to penetrating holes and may be non-penetrating holes.

Among conductors formed in opening portions, the conductive film formed on the inner surface of an opening portion (wall or bottom surface) is referred to as a conformal conductor, and the conductor filled in an opening portion is referred to as a filled conductor. Also, the conductor formed in a via hole (wall or bottom surface) is referred to as a via conductor, and the conductor formed in a through hole (wall surface) is referred to as a through-hole conductor. Stacked conductors mean an assembly made by stacking filled conductors in two or more layers.

Plating means depositing a layer of conductor (such as metal) on surfaces of metal, resin or the like as well as the deposited conductive layer (such as a metal layer). Plating includes wet plating such as electrolytic plating as well as dry plating such as PVD (physical vapor deposition) and CVD (chemical vapor deposition).

Unless otherwise specified, the "width" of a hole or a column (a protrusion) indicates the diameter if it is a circle, and $2\sqrt{}$ (cross section/$\pi$) if it is other than a circle. If a hole or a column (a protrusion) tapers, whether "widths" in two or more holes or protrusions are the same or not the same may be determined by comparing the values of corresponding portions, average values, or maximum values and the like.

First Embodiment

Wiring board 1 of a first embodiment has wiring board 10 (first multilayer wiring board) and wiring board 20 (second multilayer wiring board). Wiring boards (10, 20) are each a rigid wiring board.

As shown in FIG. 1, wiring board 10 has insulative substrate 100 (the core substrate of wiring board 10), conductive layers (110*a*, 110*b*, 111, 112), insulation layers (101, 102) and solder-resist layer 140. Wiring board 11 of the present embodiment has four conductive layers (110*a*, 110*b*, 111, 112).

On one side of substrate 100, conductive layer (110*a*), insulation layer 101 and conductive layer 111 are laminated in that order, and conductive layers (110*a*, 111) are electrically connected by via conductor 121. On the other side of substrate 100, conductive layer (110*b*), insulation layer 102 and conductive layer 112 are laminated in that order, and conductive layers (110*b*, 112) are electrically connected by via conductor 122. Conductive layer (110*a*) and conductive layer (110*b*) are electrically connected to each other by via conductor 120.

A via hole is formed in substrate 100, and copper plating, for example, is filled in the via hole to make via conductor 120 (filled conductor). Also, via holes are formed in insulation layers (101, 102), and copper plating, for example, is filled in each via hole to make via conductors (121, 122) (each a filled conductor).

Solder-resist layer 140 is formed on a first surface of wiring board 10 (on insulation layer 101 and conductive layer 111). An opening portion is formed in solder-resist layer 140 so that the outermost conductive layer (conductive layer 111) is exposed as a pad (external connection terminal). Also, pad (P1) for connection with wiring board 20 is formed on a second surface of wiring board 10.

Wiring board 20 is connected to the first surface of wiring board 10 through adhesive-sheet layer 43. The planar shapes (on the X-Y plane) of wiring boards (10, 20) and adhesive-sheet layer 43 are each approximately rectangular, for example. However, that is not the only option, and the shape and dimensions of each wiring board are determined freely.

As shown in FIG. 1, wiring board 20 has insulative substrate 200 (the core substrate of wiring board 20), conductive layers (210*a*, 210*b*, 211, 212), insulation layers (201, 202) and solder-resist layer 240. Wiring board 20 of the present embodiment has four conductive layers (210*a*, 210*b*, 211, 212). Wiring board 20 has via conductors in all the interlayers between conductive layers.

On one side of substrate 200, conductive layer (210*a*), insulation layer 201 and conductive layer 211 are laminated in that order, and conductive layers (210*a*, 211) are electrically connected by via conductor 221. On the other side of substrate 200, conductive layer (210*b*), insulation layer 202 and conductive layer 212 are laminated in that order, and conductive layers (210*b*, 212) are electrically connected by via conductor 222. Conductive layer (210*a*) and conductive layer (210*b*) are electrically connected to each other by via conductor 220.

A via hole is formed in substrate 200, and copper plating, for example, is filled in the via hole to make via conductor 220 (filled conductor). Also, via holes are formed in insulation layers (201, 202), and copper plating, for example, is filled in each via hole to make via conductors (221, 222) (each a filled conductor). In wiring board 20 of the present embodiment, stacked structure (St) (vertical wiring portion) is formed by stacking via conductors (220~222) of all the layers. However, stacking via conductors (220~222) is not the only option.

Pad (external connection terminal) (P2) for connection with wiring board 10 is formed on a third surface of wiring board 20. Also, solder-resist layer 240 is formed on a fourth surface of wiring board 20 (insulation layer 202 and conductive layer 212). An opening portion is formed in solder-resist layer 240 so that the outermost conductive layer (conductive layer 212) is exposed as a connection pad.

Substrates (100, 200) are each made by impregnating glass cloth (core material) with epoxy resin (hereinafter referred to as glass epoxy), for example. The core material has a smaller thermal expansion coefficient than the main material (epoxy resin in the present embodiment). As for the core material, inorganic materials such as glass fiber (glass cloth or glass non-woven fabric, for example), aramid fiber (aramid non-woven fabric, for example) or silica filler are considered preferable. However, basically, the material of substrates (100, 200) is not limited specifically. For example, instead of using epoxy resin, polyester resin, bismaleimide triazine resin (BT resin), imide resin (polyimide), phenol resin, allyl polyphenylene ether resin (A-PPE resin) or the like may also be used. Each substrate may be formed with multiple layers made of different materials.

Insulation layers laminated on the core substrate (substrates (100, 200)) are each made of glass epoxy, for example. However, that is not the only option, and the material for the insulation layers is determined freely. For example, instead of using epoxy resin, polyester resin, bismaleimide triazine resin (BT resin), imide resin (polyimide), phenol resin, allyl polyphenylene ether resin (A-PPE resin) or the like may also be used. Each insulation layer may be formed with multiple layers made of different materials.

Conductive layers formed on the core substrate or on insulation layers laminated on the core substrate are each made of a copper foil (lower layer) and copper plating (upper layer), for example. Such conductive layers have wiring for forming electrical circuits (inner-layer wiring), lands, plain patterns for enhancing the strength of the wiring board and the like, for example.

Via conductors connecting each conductive layer (between layers) are made of copper plating, for example. The shape of the via conductors is a tapered column (truncated cone), for example. Via conductors formed in buildup layers taper with a diameter that increases as it goes away from the core substrate, for example. However, that is not the only option, and the shape of via conductors is determined freely. Also, instead of via conductors, or in addition to via conductors, by forming through holes in the core substrate or insulation layers, and by forming copper-plated film, for example, on the wall surfaces of those through holes, through-hole conductors (conformal conductors) may be formed. Insulator is filled inside the through-hole conductors. Through-hole conductors are made of copper plating, for example, and through holes are shaped columnar, for example. However, that is not the only option, and the shape of through-hole conductors is not limited specifically.

The materials for conductive layers and via conductors are not limited specifically as long as they are conductive. They may be metallic or non-metallic. Conductive layers, via conductors and through-hole conductors may each be formed with multiple layers made of different materials.

Solder-resist layers are each made of photosensitive resin using acrylic-epoxy resin, for example. However, that is not the only option, and the material of solder-resist layers may be resins such as thermosetting resin mainly containing epoxy resin or UV-curable resin.

In the present embodiment, wiring boards (10, 20) are connected through adhesive-sheet layer 43. Specifically, as shown in FIG. 1, wiring boards (10, 20) are positioned in such a way that pad (P1) of wiring board 10 faces pad (P2) of wiring board 20, and pads (P1, P2) are electrically connected through conductive bonding layer 41. Wiring board 10 and wiring board 20 are adhered by adhesive-sheet layer 43 formed around bonding layer 41.

Pad (P1) is formed directly on via conductor 122 in insulation layer 102 of wiring board 10. The diameter of via conductor 122 increases toward the outer layer of wiring board 10 (the side where wiring board 20 is positioned), and pad (P1) is formed to make contact with the surface toward which the diameter of via conductor 122 increases. Also, pad (P2) is formed directly on via conductor 221 in insulation layer 201 of wiring board 20. The diameter of via conductor 221 increases toward the outer layer of wiring board 20 (the side where wiring board 10 is positioned), and pad (P2) is formed to make contact with the surface toward which the diameter of via conductor 221 increases.

Figure 2A:
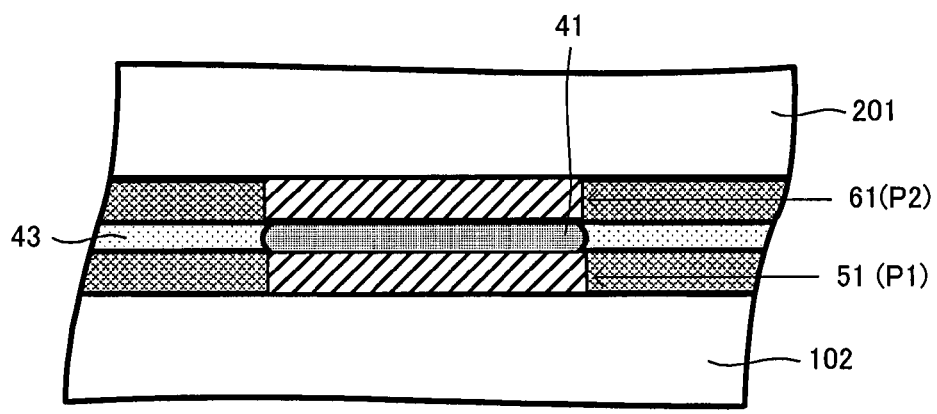
FIG. 2A is a cross-sectional view showing pads of first and second multilayer wiring boards shown in FIG. 1.
Figure 2B:
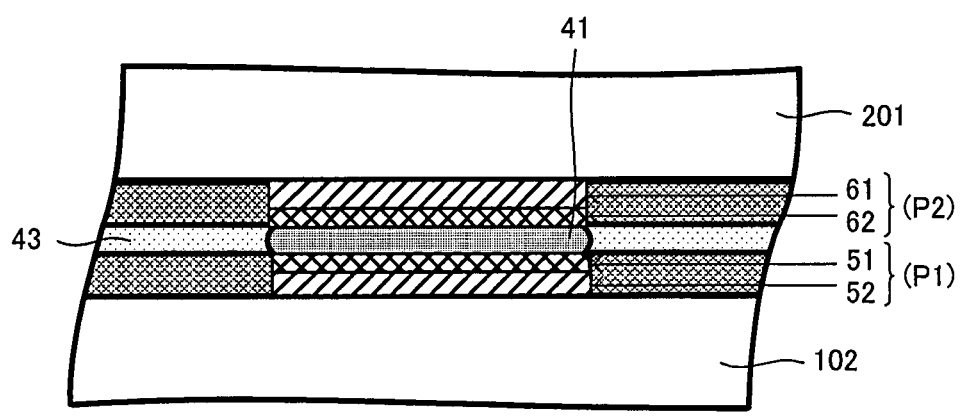
FIG. 2B is a cross-sectional view showing another example of pads of first and second multilayer wiring boards shown in FIG. 1.

Pads (P1, P2) are each made of copper layer 51, for example, as shown in FIG. 2A. Since copper has excellent conductivity, it is suitable for wiring material. However, that is not the only option, and coating layer 52 may be formed on copper layer 51 as shown in FIG. 2B, for example. Coating layer 52 is made of Ni (lower layer)-Au (upper layer), for example. Corrosion of copper is suppressed by forming an Ni—Au layer on the copper surface.

Bonding layer 41 for electrically connecting pads to each other is made of tin (Sn), for example. Since tin has excellent connectability, the connection reliability of pads improves by forming tin on pad surfaces. However, that is not the only option, and solder (tin-lead alloy) or ACF (anisotropic conductive film), for example, may also be used instead of tin for the material of bonding layer 41. Bonding layer 41 is preferred to be made of metallic material having a melting point of 200~250° C. Using such metallic material, it is easy to melt and harden the material by heating or cooling. Also, when solder is used as the material of bonding layer 41, compositions such as Sn—Ag—Cu, Sn—Cu—Ni, Sn—Bi or the like may be used. Moreover, to avoid formation of voids caused when copper in the pads diffuses into tin, a barrier metal (such as Ni) may be formed on pad surfaces, or the same ingredient (such as Ni) may be contained in the solder.

Pads (P1) are included in conductive layer 112, and pads (P2) are included in conductive layer 211. In the present embodiment, pads (P1) and other wiring are formed in conductive layer 112 of wiring board 10, whereas only pads (P2) are formed in conductive layer 211 of wiring board 20. Then, bonding layer 41 is formed on pads (P2) in conductive layer 211 where only pads (P2) are formed, and the upper surface (the side facing pads (P2)) of conductive layer 112, where pads (P1) and other wiring are formed, is roughened. The roughened surface may be formed when conductive layer 112 is formed, or the surface may be roughened using a chemical agent or the like after conductive layer 112 has been formed.

Adhesive-sheet layer 43 to adhere wiring boards to each other is made of cured adhesive sheet 45. For adhesive sheet 45, the following is used, for example: prepreg made by impregnating a base such as glass fiber or aramid fiber with resins such as epoxy resin, polyester resin, bismaleimide triazine resin (BT resin), imide resin (polyimide), phenol resin, allyl polyphenylene ether resin (A-PPE resin) or the like; or RCF (resin-coated copper foil).

In wiring board 1 of the present embodiment, wiring board 10 and wiring board 20 are connected through adhesive-sheet layer 43 in such a way that pad (P1) of wiring board 10 faces pad (P2) of wiring board 20. Accordingly, connecting wiring boards with different numbers of layers and thicknesses is achieved. As a result, wiring boards that are individually designed to be optimal are connected to each other, and the design flexibility of each wiring board is enhanced. In addition, connection of wiring boards is achieved without using component mounting technology such as soldering, and connection reliability is enhanced.

Figure 3:
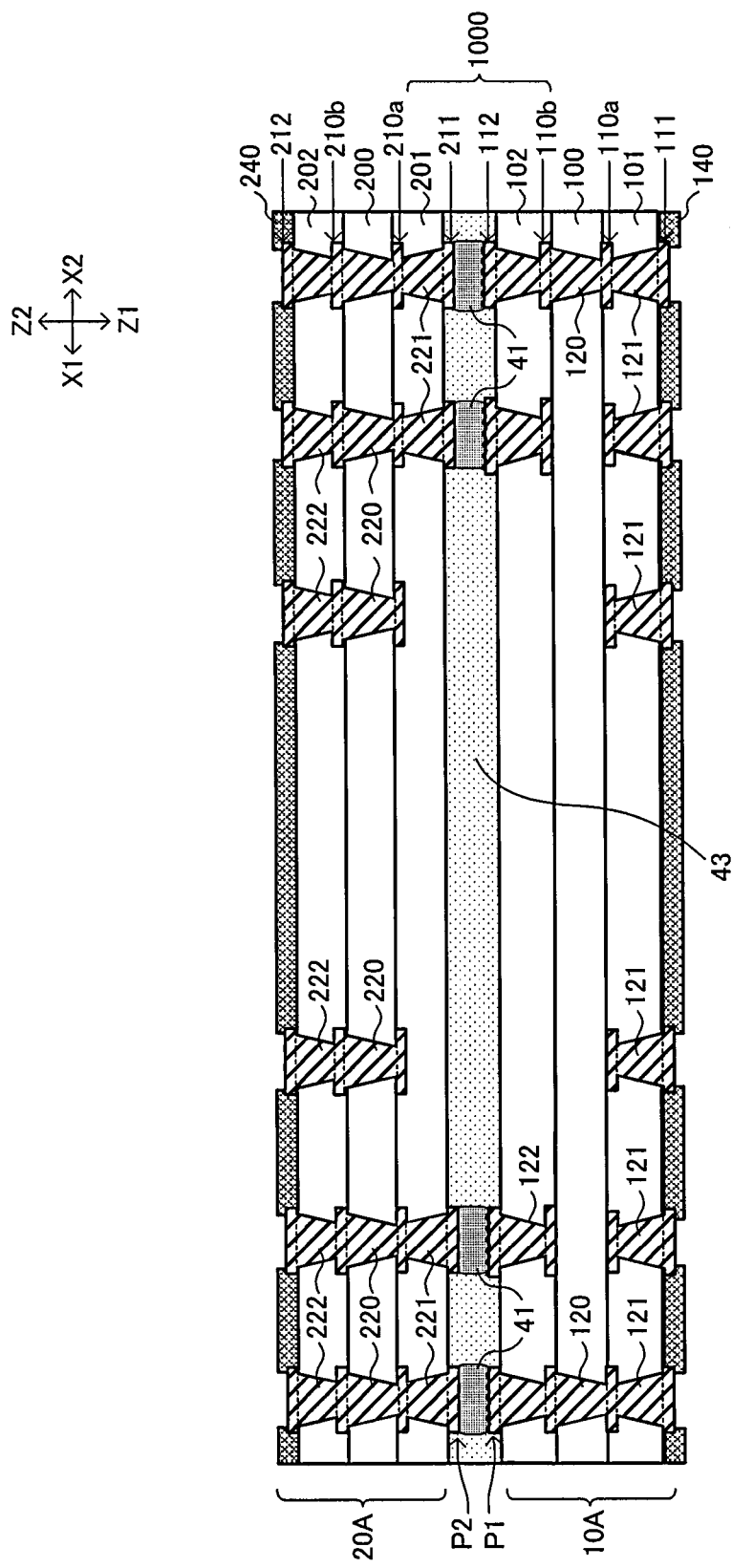
FIG. 3, in another embodiment of the present invention, is a view showing an example in which insulation layers of first and second multilayer wiring boards positioned adjacent to each other and an adhesive sheet work as a core.

Also, in wiring board 1 of the present embodiment, outermost conductive layers (112, 211) including pads (P1, P2) and via conductors (122, 221) are formed only to be connected to conductive layers (110a, 210b), which are positioned as one layer inside as shown in FIG. 3, for example. Accordingly, insulation layers (101, 202) and adhesive-agent layer 43 between conductive layer (110a) and conductive layer (210b) function as a core. As a result, wiring board 1 obtains dielectric layer 1000 with a greater thickness (the thickness obtained by adding thicknesses of insulation layers (101, 202) and adhesive-agent layer 43), and excellent impedance matching is achieved.

Also, in wiring board 1 of the present embodiment, directions of via conductors connecting conductive layers are inversed more than twice when seen along a lamination direction of the wiring board.

In the following, a method for manufacturing wiring board 1 of the present embodiment is described.

Figure 4:
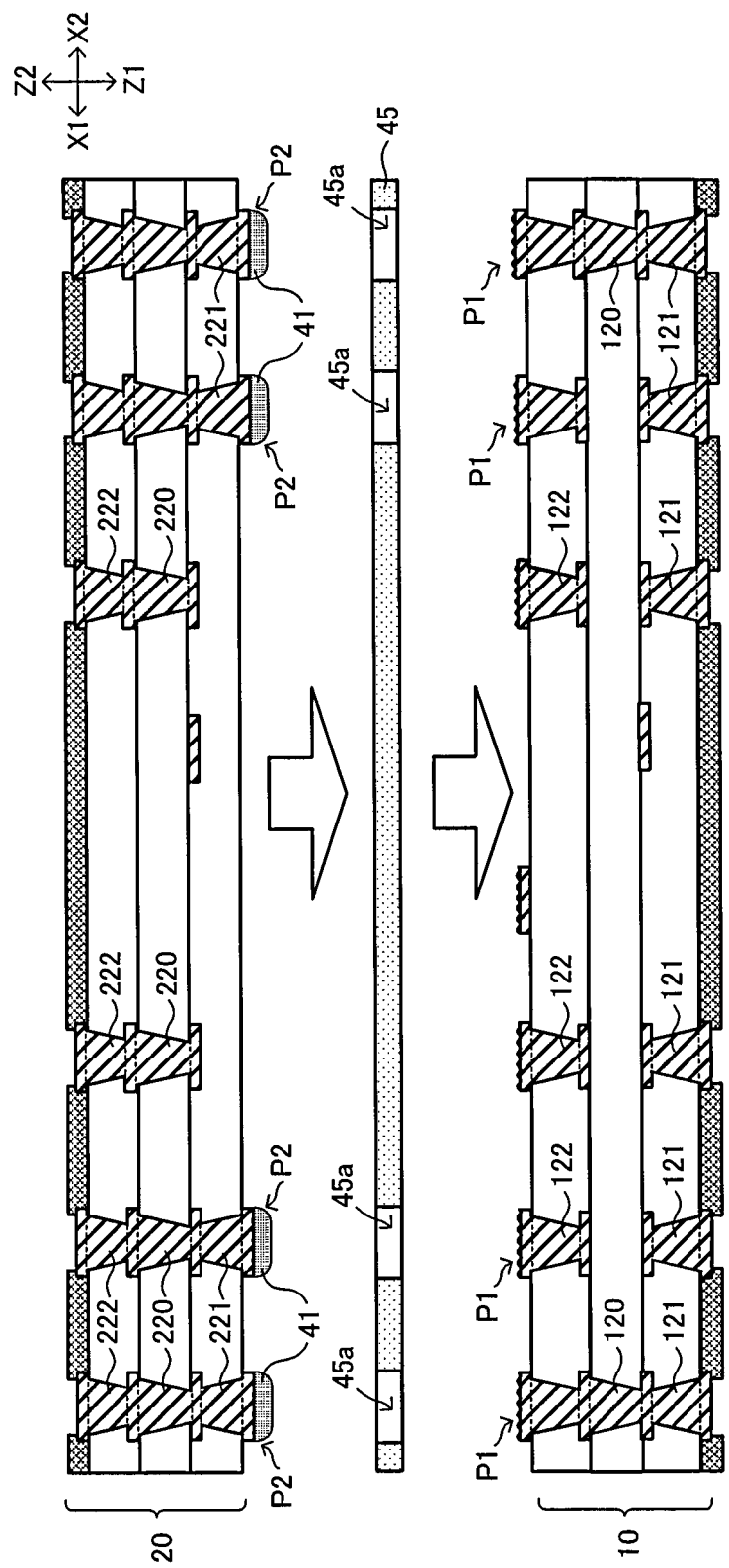
FIG. 4 is a view illustrating a method for manufacturing a wiring board according to the first embodiment of the present invention.

First, wiring boards (10, 20) are prepared individually as shown in FIG. 4. Wiring boards (10, 20) are each obtained by alternately laminating insulation layers and conductive layers on a double-sided copper-clad laminate as a starting material, for example, and by connecting conductive layers (between layers) through via conductors. During that time, coating layers may be formed on outermost layers of wiring boards (10, 20). Such coating layers may be formed by selective plating, for example.

Insulation layers are formed by vacuum lamination using thermosetting prepreg, for example. However, that is not the only option, and thermoplastic resin or RCF (resin-coated copper foil) may also be used, or pressing may be conducted for adhesion.

Conductive layers are formed by using any one method or any combination of two or more methods of the following: panel plating, pattern plating, full-additive, semi-additive (SAP), subtractive and tenting methods.

Via conductors (filled conductors, for example) are formed by forming holes in insulation layers using a laser, for example, and by filling conductor in the holes when performing plating for forming conductive layers on insulation layers.

Wiring boards (10, 20) may be obtained by separating individual units from an assembly of multiple wiring boards. For example, panel 4000 (an assembly of multiple wiring boards), which is formed with multiple wiring boards (21a)

Figure 5:
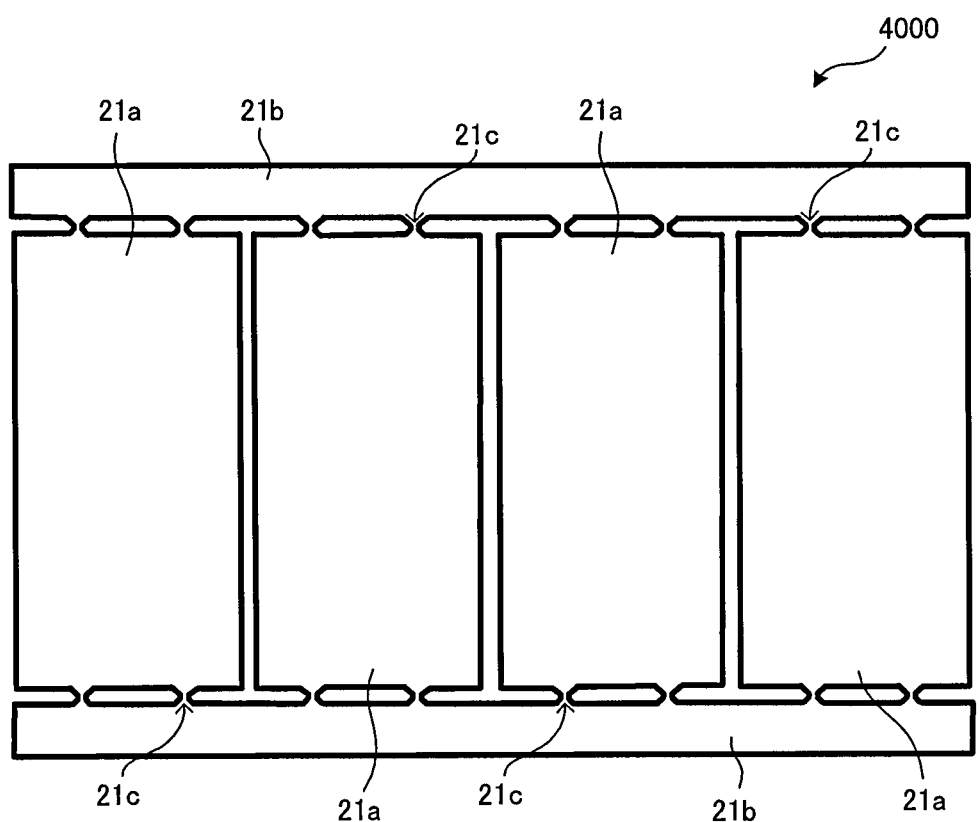
FIG. 5 is a view illustrating a step for preparing first and second multilayer wiring boards in the method for manufacturing a wiring board according to the first embodiment of the present invention.

(either wiring board 10 or 20, for example), frame (21b) and bridges (21c), is prepared as shown in FIG. 5. Then, a unit of wiring board (21a) is taken out by separating frame (21b) and wiring boards (21a) at bridges (21c). In panel 4000, multiple wiring boards (21a) are connected to common frame (21b) by bridges (21c) to be integrated. Wiring boards (21a) may be removed from frame (21b) by cutting bridges (21c) using a router, for example.

Conductive bonding layer 41 is formed on pad (P2) of wiring board 20. Bonding layer 41 is formed as follows, for example: resist is formed on the surface where pad (P2) is formed; a hole is formed in the resist by etching; tin plating is filled in the hole; and the resist is removed. Bonding layer 41 formed as above protrudes from insulation layer 201. However, the above is not the only option. Bonding layer 41 may be formed by printing, by laminating sheet-type bonding layer 41 on the wiring board, or by dipping the wiring board in fused solder (solder bath).

Figure 6:
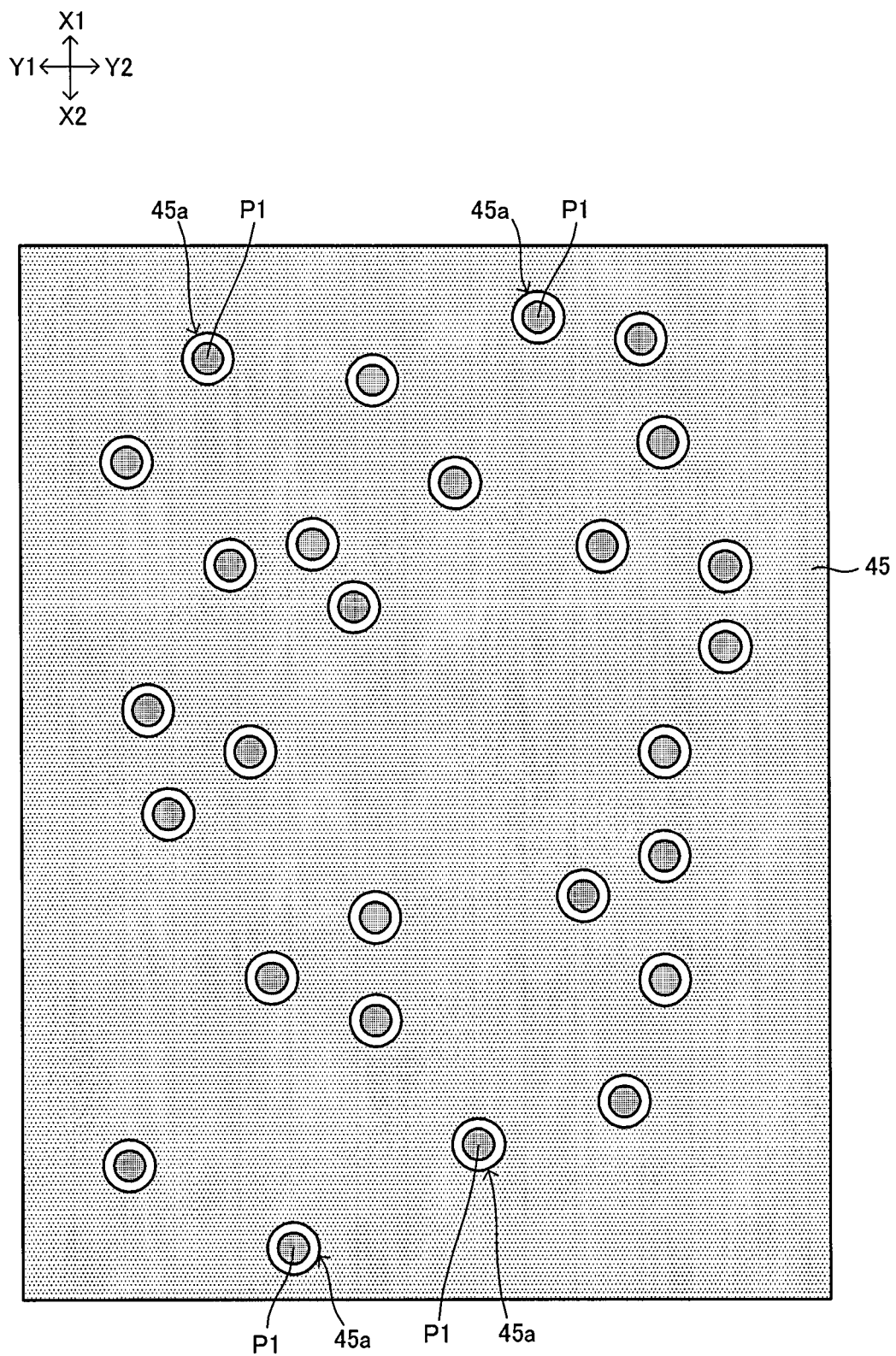
FIG. 6 is a plan view when an adhesive sheet is positioned on the first multilayer wiring board according to the first embodiment of the present invention.
Figure 7A:
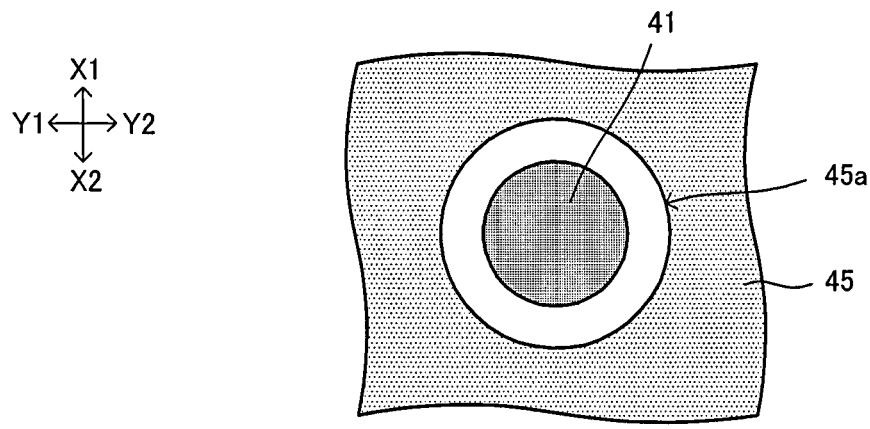
FIG. 7A is a magnified view showing the vicinity of a penetrating hole in the adhesive sheet shown in FIG. 6.
Figure 7B:
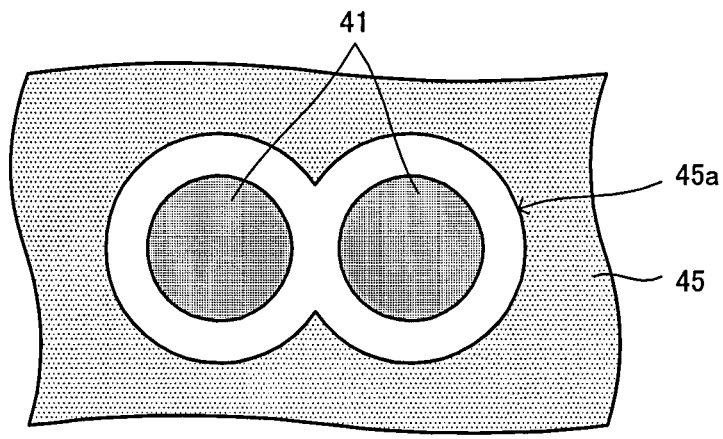
FIG. 7B is a magnified view showing another example of a penetrating hole in the adhesive sheet shown in FIG. 6.
Figure 7C:
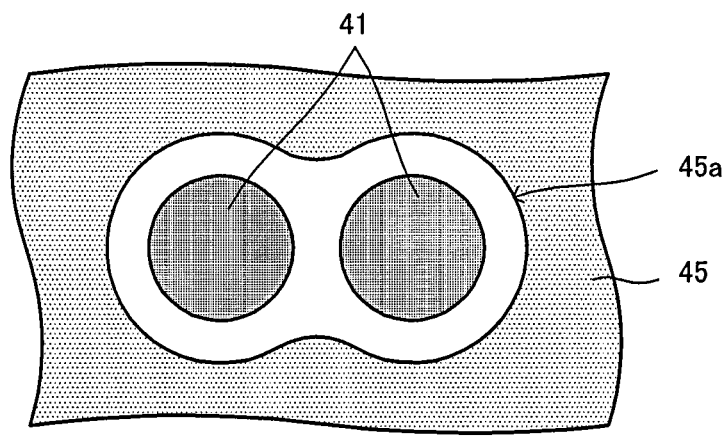
FIG. 7C is a magnified view showing yet another example of a penetrating hole in the adhesive sheet shown in FIG. 6.

Adhesive sheet 45 is prepared to adhere wiring boards (10, 20). Adhesive sheet 45 is approximately the same size as wiring boards (10, 20), and multiple penetrating holes (45a) with a greater hole diameter than pads are formed in positions corresponding to pads as shown in FIG. 6. Penetrating hole (45a) in adhesive sheet 45 is formed to have clearance (dimensional difference) such as 500 μm to the periphery of a pad as shown in FIG. 7A, for example. Also, when conductive layers of pads are close to each other, penetrating holes (45a) may be connected to place multiple pads as shown in FIG. 7B. In such situations, the periphery of penetrating holes (45a) may be formed in a smooth shape as shown in FIG. 7C. Adhesive sheet 45 may be obtained, for example, by cutting out a large adhesive sheet in the shape of wiring boards (10, 20) and by forming multiple penetrating holes (45a) in positions corresponding to pads (P1, P2) of wiring boards (10, 20).

Wiring board 10 and wiring board 20 are connected using adhesive sheet 45 prepared as above. Specifically, wiring boards (10, 20) and adhesive sheet 45 are positioned in such a way that pad (P1) of wiring board 10 and pad (P2) of wiring board 20 are located at penetrating hole (45a) in adhesive sheet 45 (see FIG. 6). As described above, penetrating holes (45a) in adhesive sheet 45 are formed larger than pads. Thus, even when manufacturing tolerance is seen in wiring boards (10, 20) or when wiring boards (10, 20) and adhesive sheet 45 are slightly shifted, it is easy to align pads with penetrating holes (45a) in adhesive sheet 45, and it is easy to align wiring boards (10, 20) and adhesive sheets (45, 46). Adhesive sheet 45 is still uncured at this stage.

Figure 8:
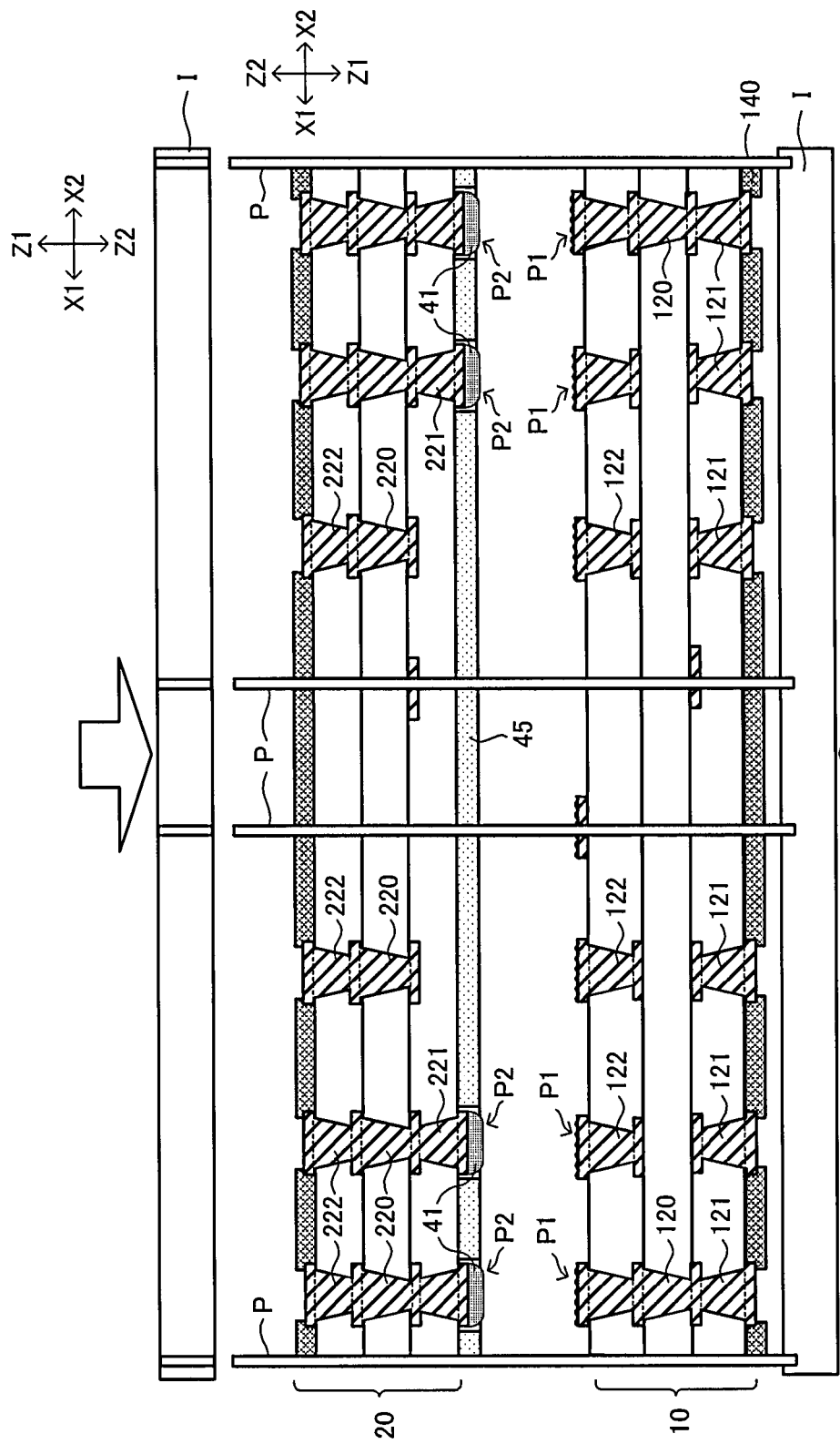
FIG. 8 is a view illustrating a step for pressing wiring boards in the method for manufacturing a wiring board according to the first embodiment of the present invention.

Pressure is added in a direction to move wiring board 10 and wiring board 20 closer to each other as shown in FIG. 8. Such pressing is hot pressing, for example. During such pressing, it is preferred to sandwich members (objects to be pressed) positioned as above using pressing jig (I) which is aligned by pins (P) as shown in FIG. 8, for example, and to press them substantially vertically to main surfaces.

Figure 9A:
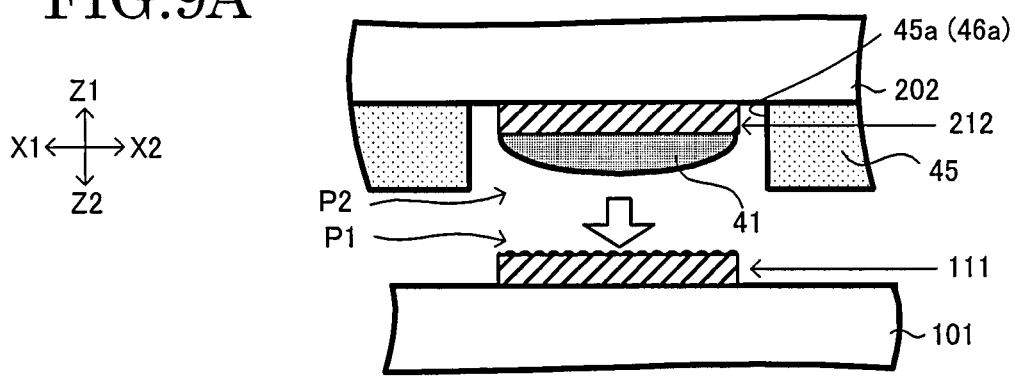
FIG. 9A, in the method for manufacturing a wiring board according to the first embodiment of the present invention, is a view illustrating a first step for connecting a first multilayer wiring board and a second multilayer wiring board or a third multilayer wiring board.
Figure 9B:
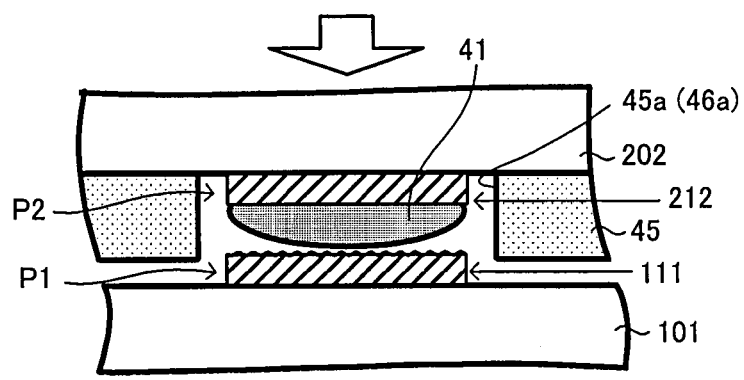
FIG. 9B is a view illustrating a second step subsequent to the step in FIG. 9A.
Figure 9C:
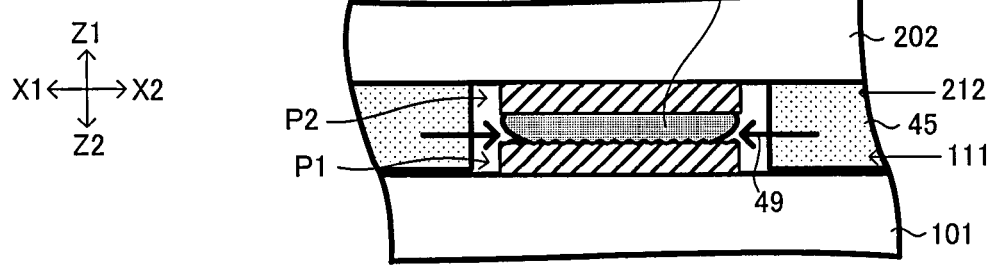
FIG. 9C is a view illustrating a third step subsequent to the step in FIG. 9B.
Figure 9D:
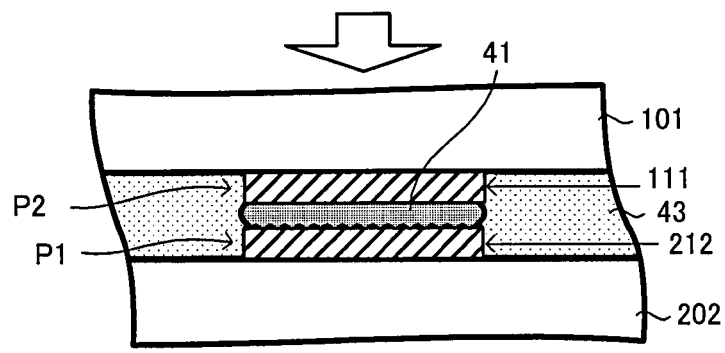
FIG. 9D is a view illustrating a fourth step subsequent to the step in FIG. 9C.

As shown in FIGS. 9A and 9B, pad (P2) of wiring board 20 comes closer to pad (P1) of wiring board 10 by the pressing procedure. Then, as shown in FIG. 9C, resin 49 seeps out from adhesive sheet 45 when pressure is added to adhesive sheet 45. The resin is filled in the gap between adhesive sheet 45 and pads (P1, P2). In addition, at the same time that pressure is added to adhesive sheet 45, bonding layer 41 formed on pad (P1) makes contact with pad (P2) and is compressed. Accordingly, metal particles in bonding layer 41 are condensed, enhancing conductivity. As a result, pad (P2) of wiring board 20 is electrically connected to pad (P1) of wiring board 10 through bonding layer 41. Then, adhesive sheet 45 is cured by pressing and heating, forming adhesive-sheet layer 43 as shown in FIG. 9D so that members are adhered to each other. Since the surface of pad (P1) is roughened in the present embodiment, adhesiveness between pad (P1) and bonding layer 41 is improved. Pressing and heating procedures may be divided into multiple procedures. Also, pressing and heating procedures may be conducted separately. Through the above connection, wiring boards (10, 20) are connected in such a way that pad (P1) of wiring board 10 faces pad (P2) of wiring board 20. Accordingly, wiring board 1 (FIG. 1) is completed.

When the pressing procedure is conducted on wiring boards (10, 20), it is preferred that resin 49 seeping out from adhesive sheet 45 not enter the gap between pads (P1, P2) before pad (P1) and pad (P2) make contact. To do so, low-flow resin may be used for adhesive sheet 45.

Solder-resist layers (140, 240) may each be formed before wiring boards (10, 20) are adhered, or may be formed after wiring boards (10, 20) are adhered.

The manufacturing method of the present embodiment is suitable for manufacturing wiring board 1. According to such a manufacturing method, an excellent wiring board 1 is obtained at low cost. Also, according to such a manufacturing method, wiring board 1 is manufactured by forming wiring boards (10, 20) individually. In doing so, panel 4000 shown in FIG. 5 is formed as an assembly of wiring boards (10, 20), for example, so that wiring boards (10, 20) are simultaneously prepared by removing them from panel 4000, and such wiring boards (10, 20) are connected by adhesive sheet 43. When wiring board 1 with eight conductive layers as shown in FIG. 1 is formed, if conductive layers and insulation layers are alternately laminated on a core substrate, eight conductive layers and six insulation layers are alternately laminated on the core substrate. By contrast, when wiring board 1 is formed with wiring boards (10, 20) removed from panel 4000, panel 4000 is prepared by forming one insulation layer on both surfaces of the core substrate, namely total two insulation layers, then wiring boards (10, 20) are removed from panel 4000, and wiring boards (10, 20) are adhered by adhesive sheet 45. Multilayer wiring board 1 is manufactured in a short duration.

Figure 10:
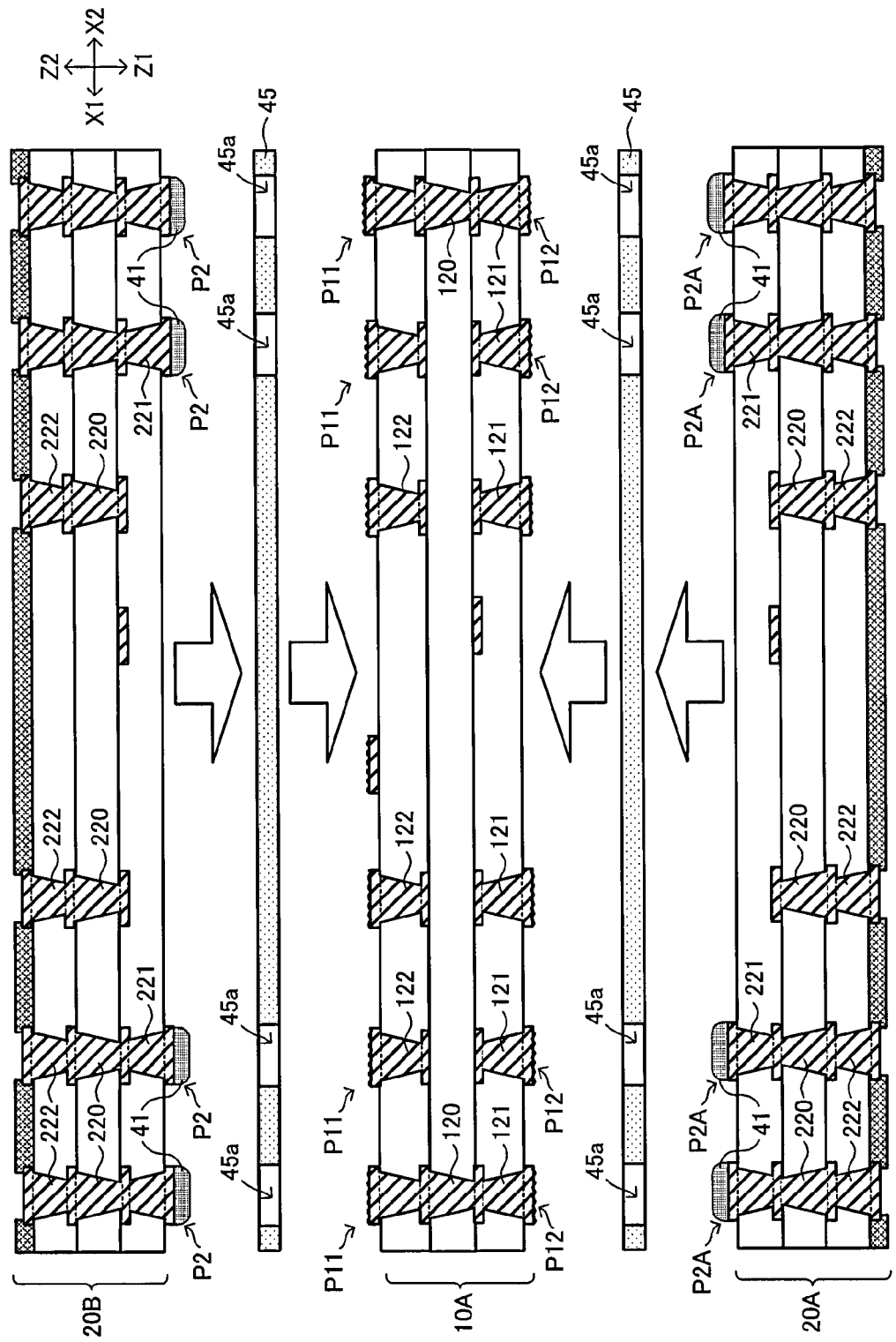
FIG. 10, in another embodiment of the present invention, is a view showing an example in which multilayer wiring boards are connected to both surfaces of a first multilayer wiring board.
Figure 11:
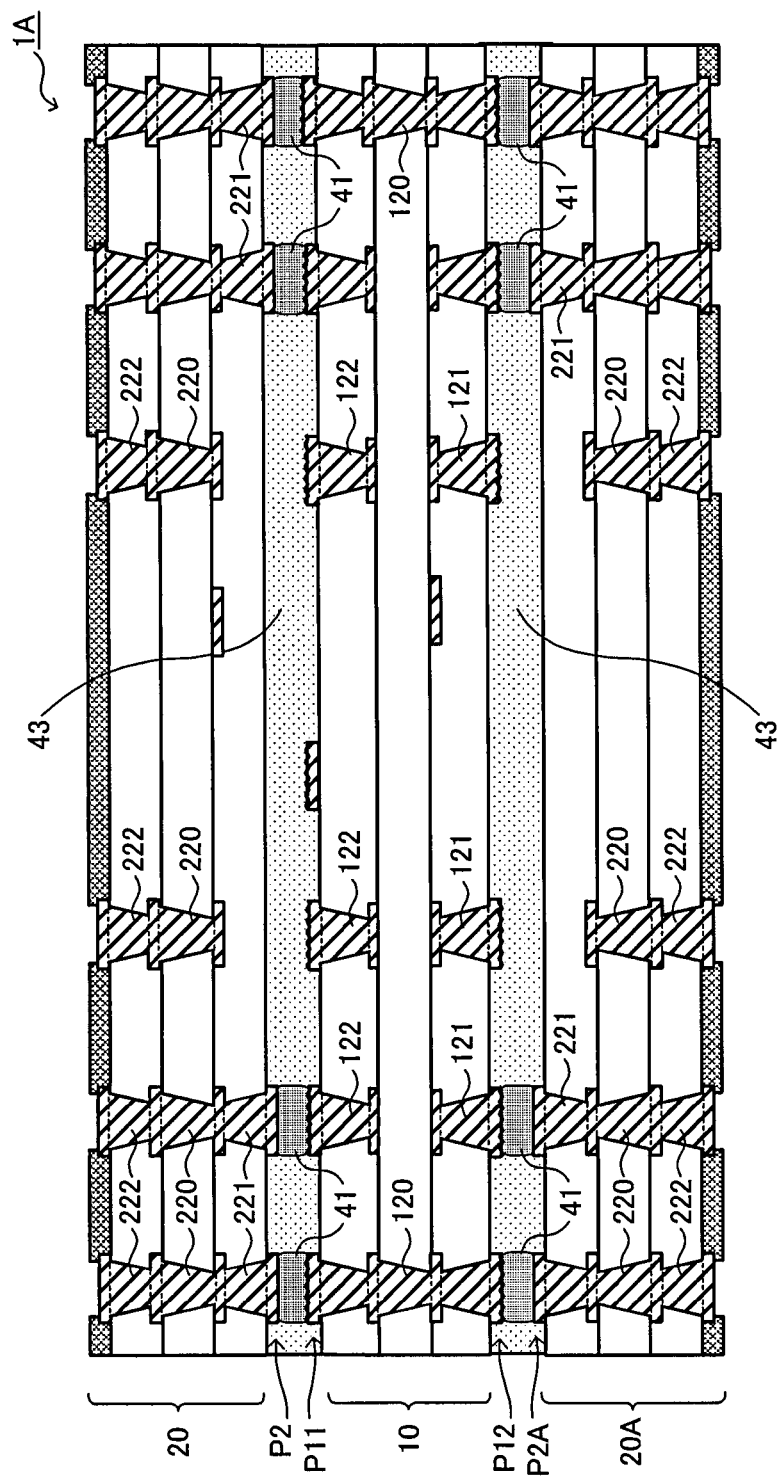
FIG. 11, in yet another embodiment of the present invention, is a view showing an example of a wiring board which is structured by connecting multilayer wiring boards to both surfaces of a first multilayer wiring board.

The manufacturing method of the present embodiment is also applied to wiring board (1A) as shown in FIG. 11, which is manufactured by preparing three wiring boards (10A, 20A, 20B) having structures substantially corresponding to wiring boards (10, 20), and by connecting each wiring board through adhesive sheet 45 as shown in FIG. 10. In such a case as well, since wiring board 1 is manufactured after wiring boards (10A~10C) are individually prepared, for example, after wiring boards (10A~10C) are removed from panel 4000, multilayer wiring board (1A) is manufactured in a short duration. Three wiring boards (10A~10C) may be adhered at the same time, or may be adhered in steps, for example, wiring board (10C) being adhered after wiring boards (10A, 10B) are adhered.

In wiring board (1A) formed as above, conductive layers are formed by laminating wiring boards (10A~10C) connected by via conductors (filled conductors), and core substrates and insulation layers are cyclically positioned in a lamination direction. Thus, differences in wiring density in each conductive layer are reduced.

Second Embodiment

Wiring board 2 of a second embodiment has wiring board 30 (first multilayer wiring board), wiring board 40 (second multilayer wiring board) and wiring board 50 (third multilayer wiring board). Wiring boards 30~50 are each a multilayer printed wiring board. In the present embodiment, wiring board 30 is a flex-rigid wiring board having rigid sections (31, 32) and flexible wiring board 33, and wiring boards (40, 50) are each a rigid wiring board.

Figure 12:
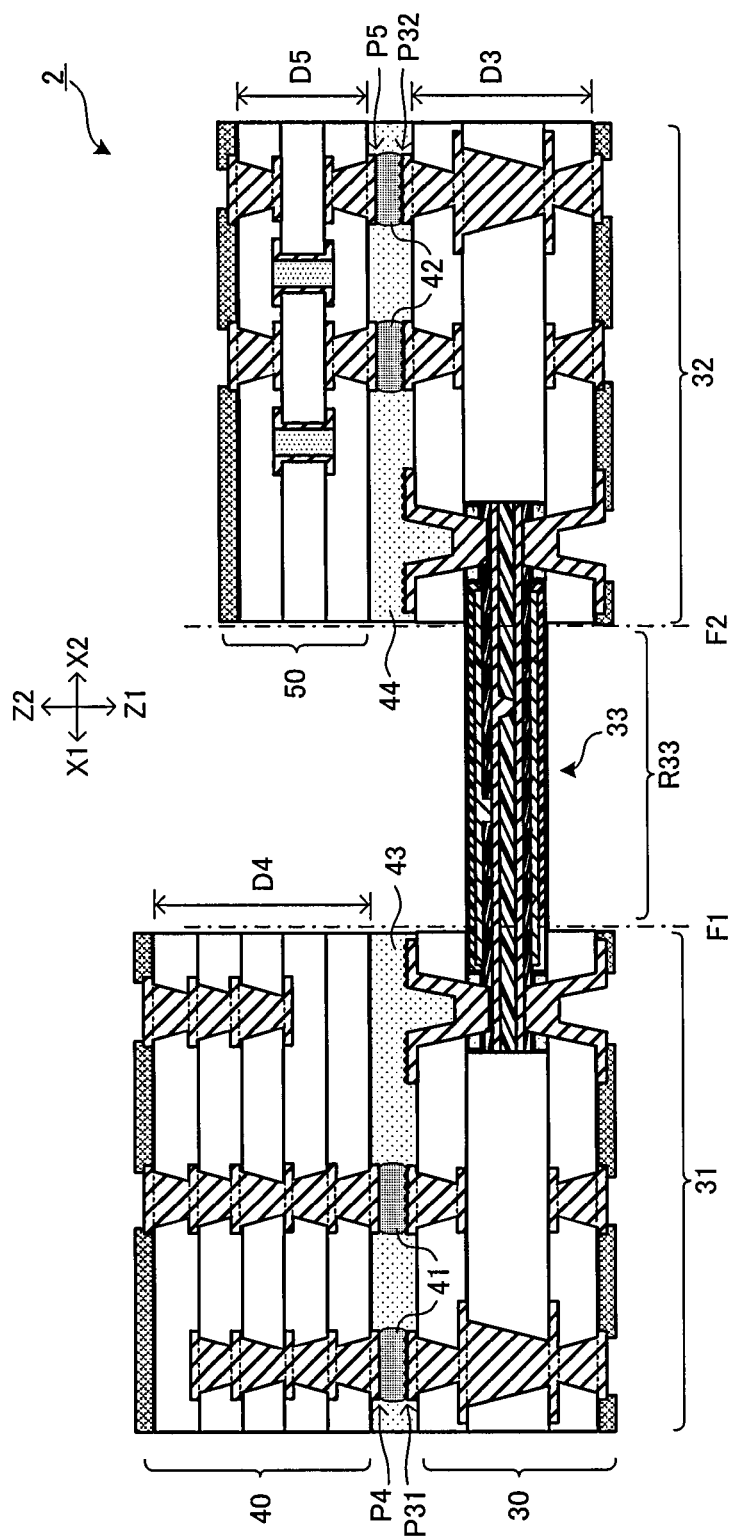
FIG. 12 is a cross-sectional view of a wiring board according to a second embodiment of the present invention.

Wiring board 30 is a printed wiring board having rigid sections (31, 32) and flexible wiring board 33 as shown in FIG. 12. Rigid section 31 and rigid section 32 are connected to each other by flexible wiring board 33. Namely, rigid section 31 and rigid section 32 face each other by sandwiching flexible wiring board 33. Specifically, both end portions of flexible wiring board 33 enter rigid sections (31, 32). Then, rigid sections (31, 32) and flexible wiring board 33 are connected to each other at the entered portions. In the drawing, boundary surface (F1) is the surface corresponding to the boundary between rigid section 31 and flexible section (R33), and boundary surface (F2) is the surface corresponding to the boundary between rigid section 32 and flexible section (R33). Also, flexible section (R33) is a flexible portion sandwiched between rigid section 31 and rigid section 32, namely, a portion of flexible wiring board 33 exposed between boundary surface (F1) and boundary surface (F2).

Figure 14:
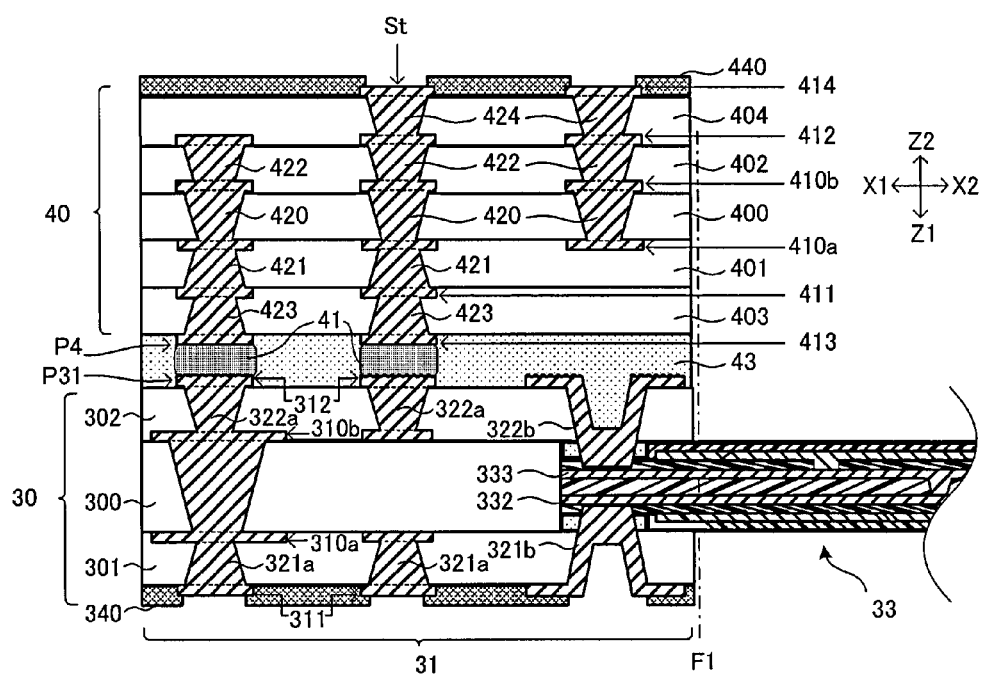
FIG. 14 is a cross-sectional view showing a second multilayer wiring board shown in FIG. 12.
Figure 15:
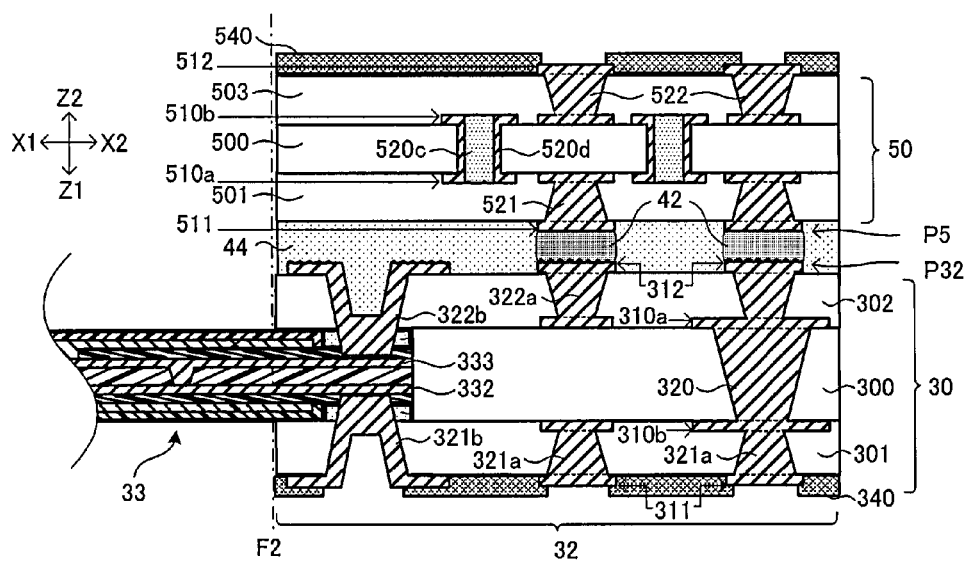
FIG. 15 is a cross-sectional view showing a third multilayer wiring board shown in FIG. 12.

As shown in FIGS. 14 and 15, rigid sections (31, 32) have insulative substrate 300 (the core substrate of wiring board 10), conductive layers (310a, 310b, 311, 312), insulation layers (301, 302) and solder-resist layer 340.

Substrate 300 is positioned to a side of flexible wiring board 33 (direction X). A gap may exist or may not exist between substrate 300 and flexible wiring board 33. However, alignment is easier without a gap. Also, if there is a gap, the gap may be filled with resin.

Conductive layer (310a) is laminated on one side of substrate 300, and insulation layer 301 and conductive layer 311 are laminated in that order on that side of substrate 300 and at an end portion of flexible wiring board 33. Conductive layer (310b) is laminated on the other side of substrate 300, and insulation layer 302 and conductive layer 312 are laminated in that order on that other side of substrate 300 and an end portion of flexible wiring board 33. Conductive layer 311 and conductive layer (310a) are electrically connected by via conductor 321, and conductive layer 312 and conductive layer (310b) are electrically connected by via conductor 322. Also, conductive layer (310a) and conductive layer (310b) are electrically connected by via conductor 320.

Solder-resist layer 340 is formed on a first surface of wiring board 30 (on insulation layer 301 and conductive layer 311). Opening portions are formed in solder-resist layer 340 so that the outermost layer (conductive layer 311) is exposed as pads (external connection terminals). In addition, pads (P31, P32) for connection with wiring boards (40, 50) are formed on a second surface of wiring board 30.

As shown in FIG. 12, for example, flexible wiring board 33 has flexible substrate 31 (the core substrate of flexible wiring board 33), conductive layers (332, 333), inner coverlays (334, 335), shielding layers (336, 337), and outer coverlays (338, 339).

Conductive layer 332 is formed on a first surface of flexible substrate 331, and conductive layer 333 is formed on a second surface of flexible substrate 331. Conductive layers (332, 333) include striped wiring to connect wiring of rigid section 31 and wiring of rigid section 32 to each other, for example. Conductive layer 332 and conductive layer 333 are electrically connected to each other by via conductor (331b).

Inner coverlays (334, 335) are formed on flexible substrate 331. Inner coverlays (334, 335) cover conductive layers (332, 333) respectively and insulate them from the outside.

Shielding layers (336, 337) are formed respectively on inner coverlays (334, 335). Shielding layers (336, 337) shield electromagnetic noise from the outside to conductive layers (332, 333) while shielding electromagnetic noise from conductive layers (332, 333) to the outside. Shielding layers (336, 337) are made of conductive paste, for example. Shielding layer 337 is electrically connected to conductive layer 333 by via conductor (335b). Here, shielding layer 336 or 337 may be formed only on one surface.

Outer coverlays (338, 339) are formed respectively on inner coverlays (334, 335). Outer coverlays (338, 339) cover shielding layers (336, 337) respectively, and insulate and protect the entire flexible wiring board 33.

As shown in FIGS. 14 and 15, flexible wiring board 33 is positioned to a side of substrate 300 (direction X). The thickness of substrate 300 is approximately the same as the thickness of flexible wiring board 33.

Wiring board 40 is positioned on a second surface of rigid section 31 of wiring board 30 through adhesive-sheet layer 43, and wiring board 50 is positioned on a second surface of rigid section 32 of wiring board 30 through adhesive-sheet layer 44. Planar shapes (X-Y plane) of rigid sections (31, 32), wiring boards (40, 50) and adhesive-sheet layers (43, 44) are each approximately rectangular, for example. However, that is not the only option, and the shape and dimensions of each wiring board are determined freely. Also, in the present embodiment, wiring boards (40, 50) are positioned on wiring board 30 so that the peripheries of rigid sections (31, 32) correspond to the peripheries of wiring boards (20, 50) as shown in FIG. 12. However, that is not the only option, and positioning of each wiring board is determined freely. For example, at least either wiring board 40 or 50 may be positioned inside the outlines of rigid sections (31, 32), or may be positioned to extend beyond the outlines of rigid sections (31, 32).

As shown in FIG. 14, wiring board 40 has insulative substrate 400 (the core substrate of wiring board 40), conductive layers (410a, 410b, 411~414), insulation layers (401~404) and solder-resist layer 240. Wiring board 40 of the present embodiment has six conductive layers (410a, 410b, 411, 412, 413, 414). Wiring board 20 has filled conductors in all the interlayers between conductive layers.

On one side of substrate 400, conductive layer (410a), insulation layer 401, conductive layer 411, insulation layer 403 and conductive layer 413 are laminated in that order, and via conductors (421, 423) electrically connect each conductive layer. On the other side of substrate 400, conductive layer (410b), insulation layer 402, conductive layer 412, insulation layer 404 and insulation layer 414 are laminated in that order, and via conductors (422, 424) electrically connect each conductive layer. Conductive layer (410a) and conductive layer (410b) are electrically connected to each other by via conductor 420.

On one side of wiring board 40, pad (P4) for connection to wiring board 30 is formed. On the other side of wiring board 40 (on insulation layer 204 and conductive layer 214), solder-resist layer 440 is formed. An opening portion is formed in solder-resist layer 440 so that the outermost conductive layer (conductive layer 414) is exposed as a bonding pad (external connection terminal).

As shown in FIG. 15, wiring board 50 has insulative substrate 500 (the core substrate of wiring board 50), conductive layers (510a, 510b, 511, 512), insulation layers (501, 502) and solder-resist layer 540. Wiring board 50 of the present embodiment has four conductive layers (510a, 510b, 511, 512). Wiring board 50 has via conductors or through-hole conductors in all the interlayers between conductive layers.

On one side of substrate 500, conductive layer (510a), insulation layer 501 and conductive layer 511 are laminated in that order, and via conductor 521 electrically connects conductive layers (510*a*, 511). On the other side of substrate 500, conductive layer (510*b*), insulation layer 502 and conductive layer 512 are laminated in that order, and via conductor 522 electrically connects conductive layer (510*b*) and conductive layer 512. Conductive layer (510*a*) and conductive layer (510*b*) are electrically connected to each other by through-hole conductor (520*c*).

On one side of wiring board 50, pad (P5) for connection with wiring board 30 is formed. On the other side of wiring board 50 (on insulation layer 502 and conductive layer 512), solder-resist layer 540 is formed. An opening portion is formed in solder-resist layer 540 so that the outermost conductive layer (conductive layer 512) is exposed as a bonding pad (external connection terminal).

Each substrate, each insulation layer, each conductive layer, each via conductor, each solder-resist layer and each pad of wiring boards (30~50) are formed using the same material and shape as those in wiring boards (10, 20) of the first embodiment, for example.

Flexible substrate 331 is made of insulative polyimide or liquid-crystal polymer, for example, and coverlays (inner coverlays (334, 335) and outer coverlays (338, 339)) are made of polyimide, for example. Also, the conductive paste of shielding layers (336, 337) contains silver fine particles, for example. The conductive paste is preferred to contain at least one of silver, gold, copper and carbon. Especially, since silver is highly conductive, it is effective for reducing noise. However, the above are not the only options, and the materials for flexible substrate 131, coverlays and shielding layers are selected freely.

As shown in FIGS. 14 and 15, the number of conductive layers of wiring board 40 (second multilayer wiring board) is different from the number of conductive layers of wiring board 50 (third multilayer wiring board) in the present embodiment. Wiring board 40 (see FIG. 14) has a greater number of conductive layers than wiring board 50 (see FIG. 15).

In the present embodiment, pad (P31) of rigid section 31 of wiring board 30 and pad (P4) of wiring board 40 are electrically connected through conductive bonding layer 41, and pad (P32) of rigid section 32 of wiring board 30 and pad (P5) of wiring board 50 are electrically connected through conductive bonding layer 42. In the present embodiment, wiring boards (40, 50) are respectively connected to rigid sections (31, 32) of wiring board 30 through separate adhesive-sheet layers (43, 44). Bonding layers (41, 42) and adhesive-sheet layers (43, 44) are made of materials the same as those of bonding layer 41 and adhesive-sheet layer 43 in the first embodiment, for example.

In the present embodiment, pads (P31, P32) and other wiring (such as wiring to connect rigid sections (31, 32) and flexible wiring board 33) are formed in conductive layer 312 of wiring board 30, and only pads (P4, P5) are formed in conductive layers (413, 511) of wiring boards (40, 50). Then, bonding layers (41, 42) are formed on pads (P4, P5) of conductive layers (413, 511) where only pads (P4, P5) are formed, and a roughened surface is formed on the upper side (the side facing pads (P4, P5)) of conductive layer 312 where pads (P31, P32) and other wiring are formed.

In wiring board 2 of the second embodiment, wiring boards 30~50 are connected through adhesive-sheet layers (43, 44) in such a way that pads (P31, P32) of wiring board 30 are positioned to face pads (P4, P5) of wiring boards (40, 50). Thus, wiring boards designed individually to be optimal are connected the same as in wiring board 1 of the first embodiment, enhancing the design flexibility of wiring boards. As for a specific purpose in using wiring boards (40, 50) mounted on wiring board 30, it is an option to use wiring board 40 with a greater number of conductive layers as a main circuit, and to use wiring board 50 with fewer conductive layers as a sub-circuit.

In the following, a method for manufacturing wiring board 2 of the present embodiment is described.

Figure 16:
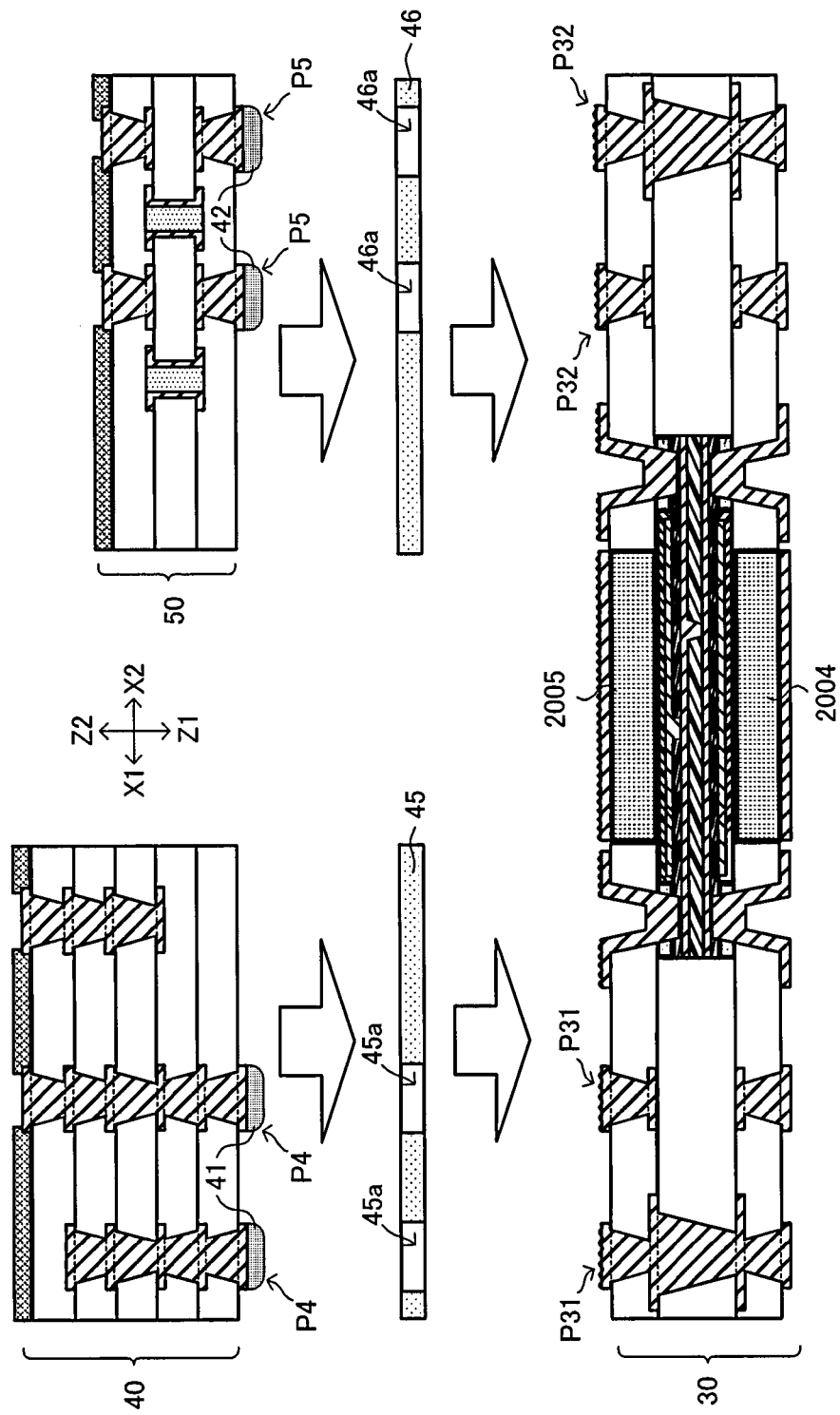
FIG. 16 is a view illustrating a method for manufacturing a wiring board according to the second embodiment of the present invention.

First, wiring boards 30~50 are individually prepared as shown in FIG. 16.

Figure 17A:
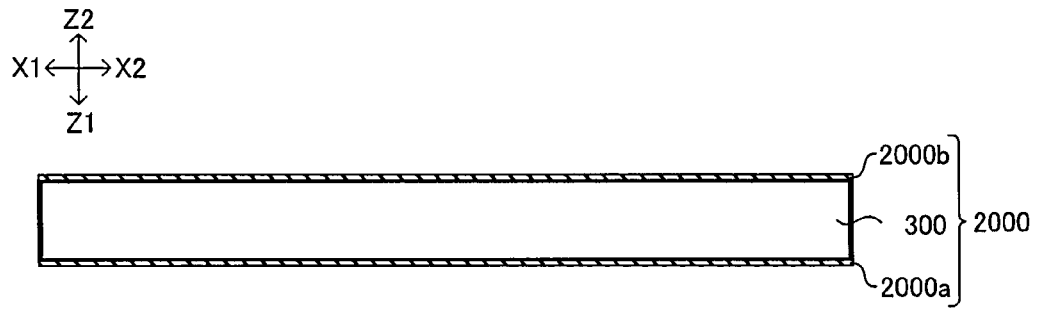
FIG. 17A is a view illustrating a first step of a method for manufacturing a core substrate.

To prepare wiring board 30 of a flex-rigid wiring board, double-sided copper-clad laminate 2000 (starting material) is prepared as shown in FIG. 17A. Double-sided copper-clad laminate 1 is formed by forming copper foils (2000*a*, 2000*b*) on first and second surfaces of substrate 300 (insulation layer).

Figure 17B:
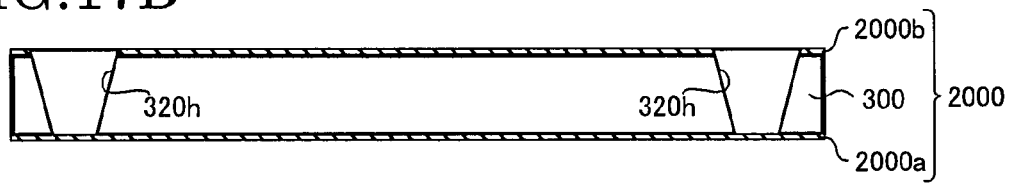
FIG. 17B is a view illustrating a second step subsequent to the step in FIG. 17A.

Using a laser, for example, holes (320*h*) are formed in substrate 300 as shown in FIG. 17B. Holes (320*h*) penetrate through copper foil (2000*b*) and substrate 300, but do not penetrate through copper foil (2000*a*). Then, desmearing and soft etching are performed if required.

Figure 17C:
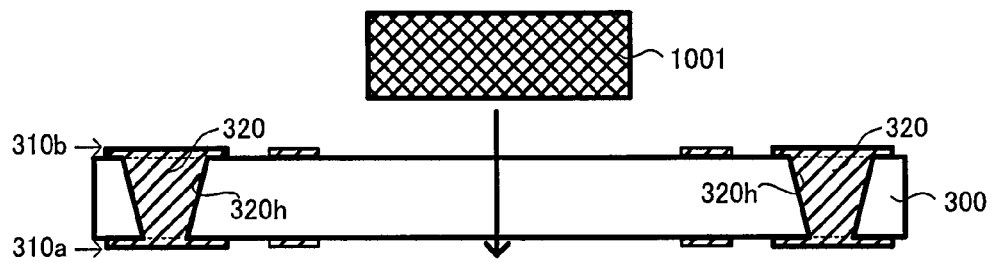
FIG. 17C is a view illustrating a third step subsequent to the step in FIG. 17B.
Figure 17D:
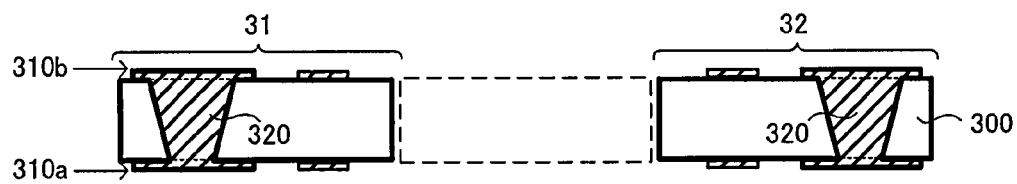
FIG. 17D is a view illustrating a fourth step subsequent to the step in FIG. 17C.

Copper panel plating (plating in holes (320*h*) and on the entire surface) is performed, and via conductors 320 are formed by filling holes (320*h*) with plating (electroless plating and electrolytic plating, for example). Then, the copper panel plating on substrate 300 is patterned by a lithographic technique. Accordingly, conductive layer (310*a*) is formed on a first surface of substrate 300, and conductive layer (310*b*) is formed on a second surface of substrate 300. Then, a horizontal roughening treatment is performed on conductive layers (310*a*, 310*b*) if required. Then, die 1001 is used to perform blanking on substrate 300 as shown in FIG. 17C. Accordingly, substrate 300 is divided into rigid section 31 and rigid section 32 as shown in FIG. 17D.

Figure 18:
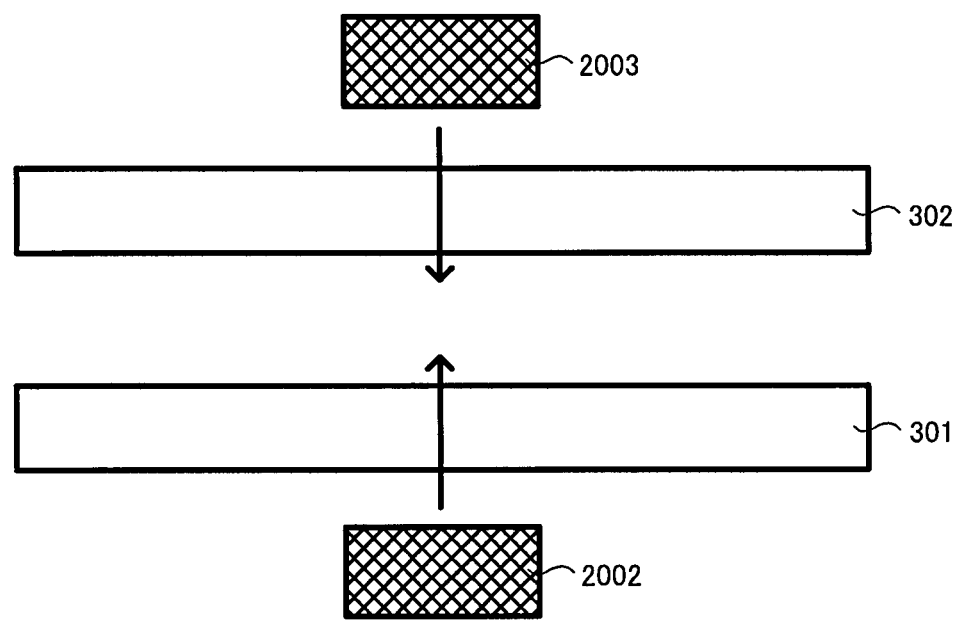
FIG. 18 is a view illustrating a first step of a method for processing interlayer insulation layers.
Figure 19:
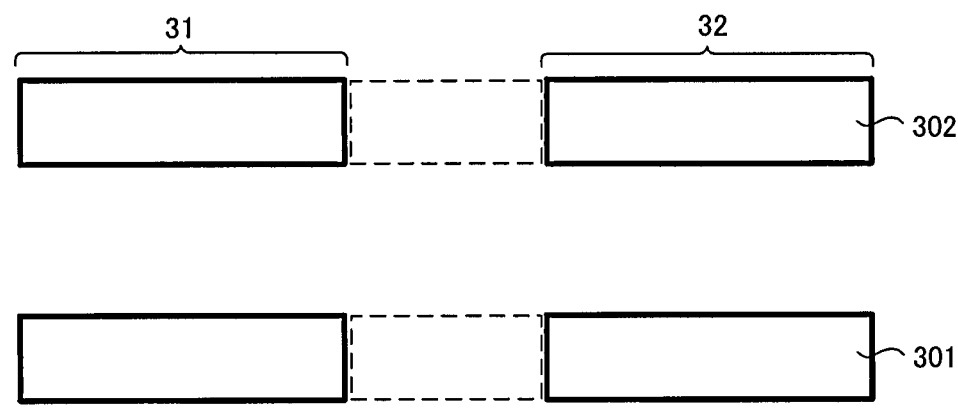
FIG. 19 is a view illustrating a second step subsequent to the step in FIG. 18.

A method for processing insulation layers (301, 302) is shown in FIGS. 18 and 19. First, as shown in FIG. 18, unprocessed insulation layers (301, 302) are prepared. At this stage, insulation layers (301, 302) are prepreg (semi-cured adhesive sheet). Especially, such prepreg is preferred to be low-flow prepreg. However, RCF (resin-coated copper foil) or the like may also be used instead of prepreg.

Die 2002 is used to perform blanking on insulation layer 301, and die 2003 is used to perform blanking on insulation layer 302. As shown in FIG. 19, insulation layers (301, 302) are each divided into rigid section 31 and rigid section 32.

A method for manufacturing flexible wiring board 33 is shown in FIGS. 20A-22. In the present embodiment, multiple flexible wiring boards 33 are simultaneously manufactured in one manufacturing panel and divided into units in a step shown in FIG. 22. However, that is not the only option, and one flexible wiring board 33 may be formed in one manufacturing panel.

Figure 20A:
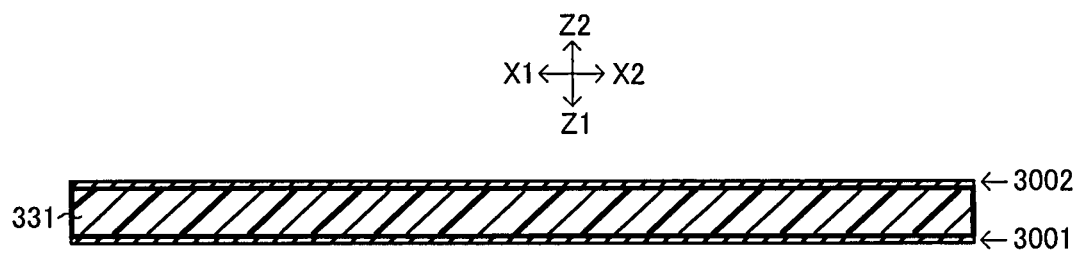
FIG. 20A is a view illustrating a first step of a method for manufacturing a flexible wiring board.

First, a double-sided copper-clad laminate (starting material) is prepared as shown in FIG. 20A. In such a double-sided copper clad laminate, copper foil 3001 is formed on a first surface of flexible substrate 331, and copper foil 3002 is formed on a second surface of flexible substrate 131.

Figure 20B:
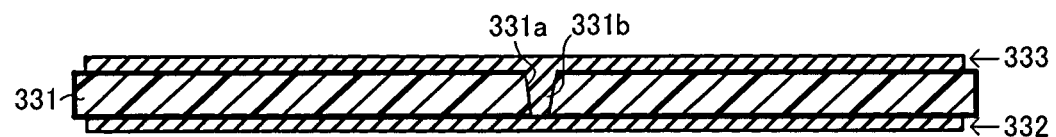
FIG. 20B is a view illustrating a second step subsequent to the step in FIG. 20A.

Conductive layers (332, 333) and via conductor (331*b*) are formed as shown in FIG. 20B.

Specifically, first, using a laser, for example, hole (331*a*) is formed in flexible substrate 331. Hole (331*a*) penetrates through flexible substrate 331 and reaches copper foil 3001. Then, desmearing and soft etching are performed if required.

Hole (331*a*) is filled with plating (electroless plating and electrolytic plating, for example) by copper panel plating (plating in hole (331*a*) and on the entire surface). Accordingly, via conductor (331*b*) is formed.

Using a lithographic technique, conductive layers on both surfaces of flexible substrate 331 are patterned. Accordingly, conductive layer 332 is formed on the first surface of flexible substrate 331, and conductive layer 333 is formed on the second surface of flexible substrate 331. Then, a horizontal roughening treatment is further performed if required.

Figure 20C:
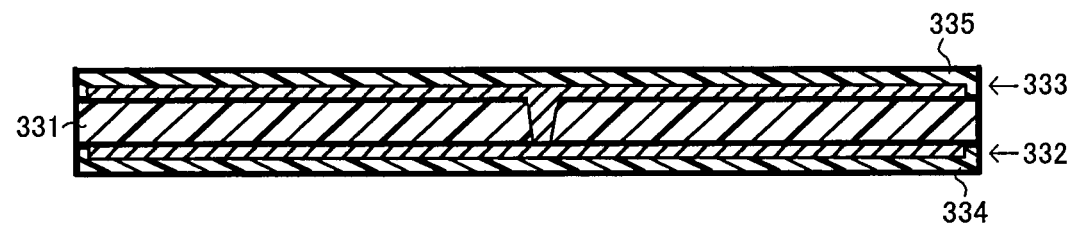
FIG. 20C is a view illustrating a third step subsequent to the step in FIG. 20B.

By pressing, for example, inner coverlay 334 is placed on the first-surface side of flexible substrate 331, and inner coverlay 335 is placed on the second-surface side of flexible substrate 331 as shown in FIG. 20C. In doing so, conductive layers (332, 333) are covered respectively by inner coverlays (334, 335). As a result, multiple flexible wiring boards 33 are manufactured. Then, jig holes are formed and electrolytic gold plating is formed if required.

Figure 21:
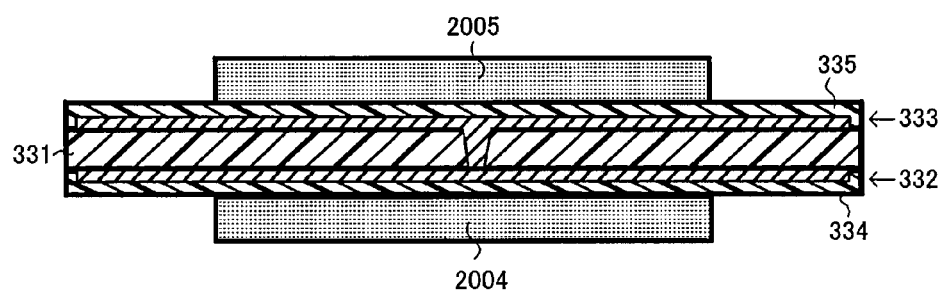
FIG. 21 is a view illustrating a fourth step subsequent to the step in FIG. 20C.

By printing, for example, strip mask 2004 is formed on the first-surface side of inner coverlay 334, and strip mask 2005 is formed on the second-surface side of inner coverlay 335 as shown in FIG. 21.

Figure 13:
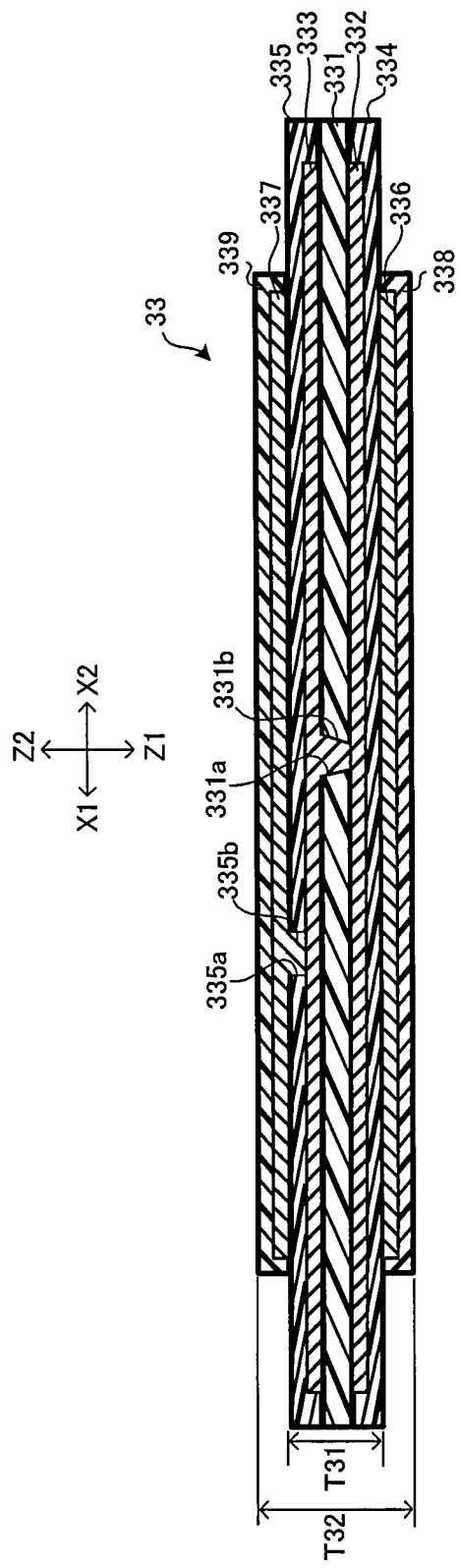
FIG. 13 is a cross-sectional view of a flexible wiring board.
Figure 22:
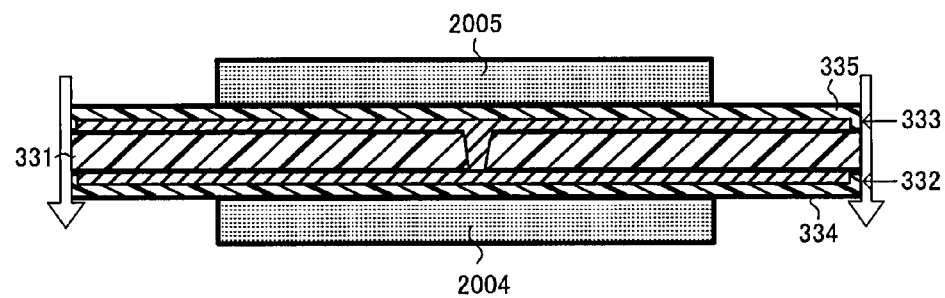
FIG. 22 is a view illustrating a fifth step subsequent to the step in FIG. 21.

Using a die, for example, a unit of flexible wiring board 33 is taken out as shown in FIG. 22. Accordingly, flexible wiring board 33 previously shown in FIG. 13 is obtained. Removing flexible wiring board 33 is not limited to using a die, and any other method may be employed. For example, a laser or a drill may be used to remove a unit.

A laminate is formed with already processed substrate 300 (core substrate), insulation layers (301, 302) and flexible wiring board 33.

Figure 23:
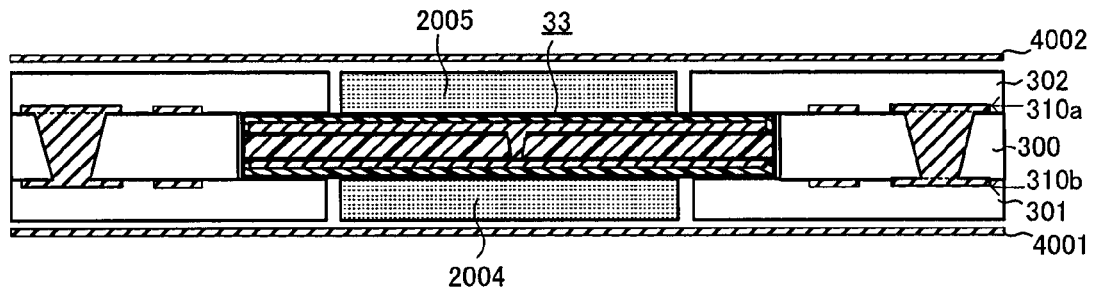
FIG. 23 is a view illustrating a first step for laminating insulation layers on the substrate.

Specifically, first, already processed substrate 300 (FIG. 17D), insulation layers (301, 302) (FIG. 19) and flexible wiring board 33 (FIG. 22) are aligned to be positioned as shown in FIG. 23, for example. Then, insulation layers (301, 302) are adhered preliminarily on substrate 300.

Substrate 300 is positioned to a side of flexible wiring board 33 (direction X). Insulation layer 301 is positioned to a side of strip mask 2004 (direction X), and insulation layer 302 is positioned to a side of strip mask 2005 (direction X). Both end portions of flexible wiring board 33 are sandwiched by insulation layers (301, 302). During that time, steps at the first surface and the second surface are made smaller because of strip masks (2004, 2005) (spacer).

Figure 24:
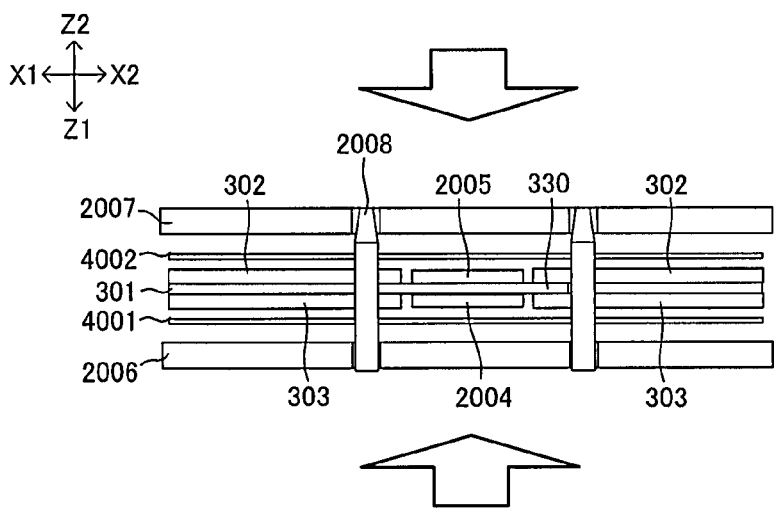
FIG. 24 is a view illustrating a second step subsequent to the step in FIG. 23.

Members aligned as above are sandwiched by pressing jigs (2006, 2007) as shown in FIG. 24, for example, and are thermal pressed all at once. Namely, pressing and heating are simultaneously conducted. During that time, jigs (2006, 2007) are aligned using pins 2008. Accordingly, pressure is added substantially vertically to main surfaces.

Figure 25:
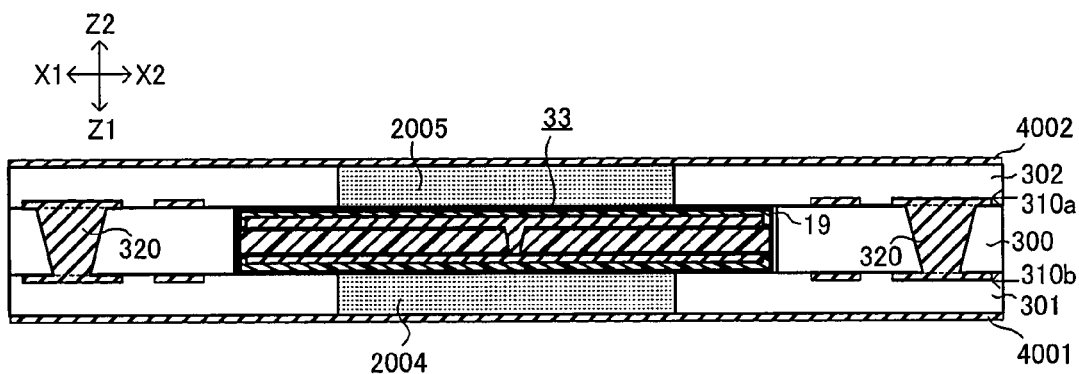
FIG. 25 is a view illustrating a third step subsequent to the step in FIG. 24.

As shown in FIG. 25, resin 19 is squeezed out from surrounding insulation layers (insulation layers (301, 302)) by the above pressing, and resin 19 is filled in a gap between substrate 100 and flexible wiring board 13. Also, prepreg (insulation layers (301, 302)) is cured by the above heating, and substrate 300 and insulation layers (301, 302) are adhered. Also, insulation layers (301, 302) and flexible wiring board 33 are bonded. The above pressing and thermal treatments may be divided into multiple procedures. Thermal treatment and pressing may be conducted separately, but it is more efficient if they are conducted simultaneously. Another thermal treatment for integration may be conducted after the above thermal pressing.

Figure 26A:
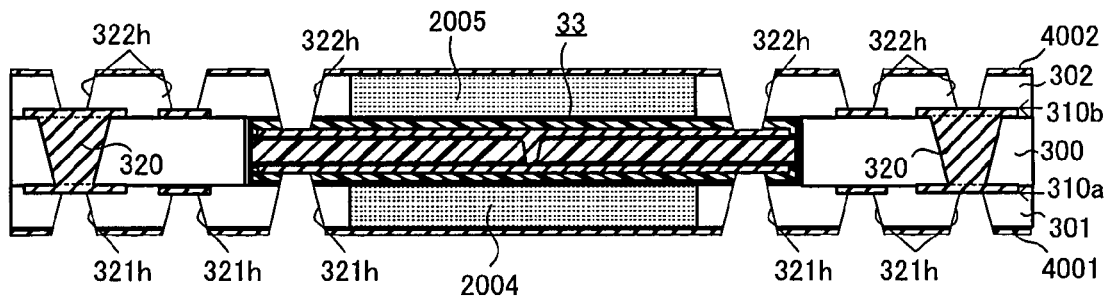
FIG. 26A is a view illustrating a first step for laminating conductive layers on the insulation layers.

Using a laser, for example, holes (321h, 322h) are formed in insulation layers (301, 302) as shown in FIG. 26A. Holes (321h, 322h) penetrate through substrates (301, 302) and reach conductive layers (310a, 310b). Then, desmearing and soft etching are conducted if required.

Figure 26B:
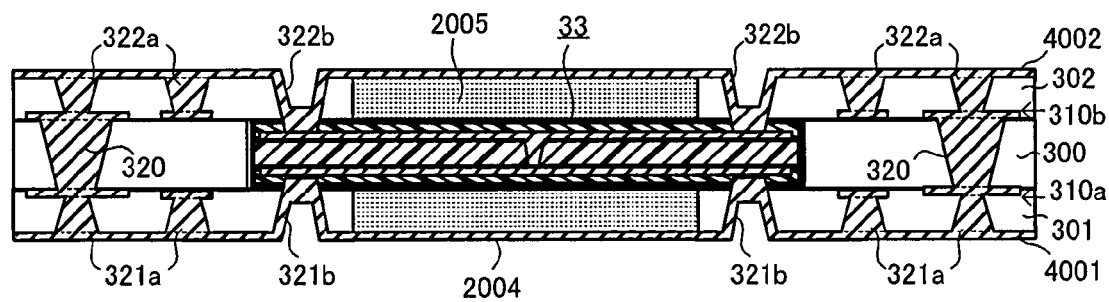
FIG. 26B is a view illustrating a second step subsequent to the step in FIG. 26A.

Holes (321h, 322h) are filled with plating (electroless plating and electrolytic plating, for example) through copper panel plating (plating in holes (321h, 322h) and on the entire surface). Accordingly, via conductors (321, 322) are formed as shown in FIG. 26B.

Figure 27:
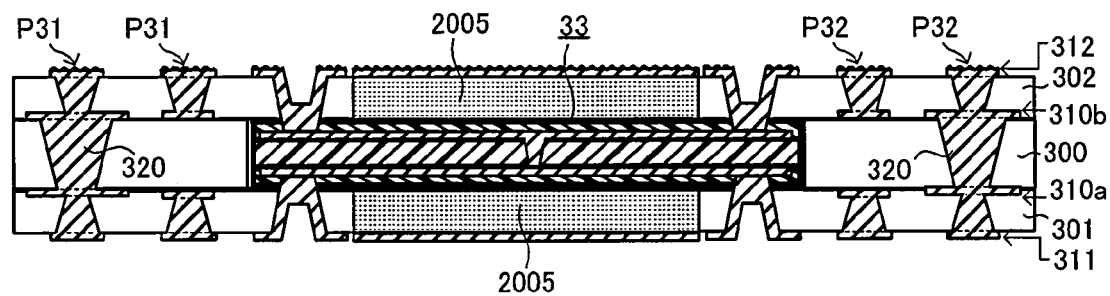
FIG. 27 is a view illustrating a third step subsequent to the step in FIG. 26B.

Copper panel plating on insulation layers (301, 302) is patterned by a lithographic technique as shown in FIG. 27. Conductive layer 311 is formed on the first surface of insulation layer 301, and conductive layer 312 is formed on the second surface of insulation layer 302. Then, a horizontal roughening treatment is conducted on conductive layers (311, 312) to roughen their surfaces. Wiring board 30 (FIG. 16) is prepared according to the above steps. In the manufacturing method of the present embodiment, strip masks (2004, 2005) remain on wiring board 30 until wiring boards (40, 50) are mounted on wiring board 30.

Rigid wiring boards (40, 50) are each obtained by using a double-sided copper-clad laminate, for example, as a starting material, and by alternately laminating insulation layers and conductive layers while connecting conductive layers by via conductors or through-hole conductors, the same as in wiring boards (10, 20) according to the first embodiment. Conductive bonding layer 41 is formed on pads (P4, P5) of wiring boards (40, 50), the same as in wiring board 20 of the first embodiment.

Through-hole conductors (such as conformal conductors) are formed by using a laser, for example, to form holes in the core substrate and by forming conductive film on wall surfaces of the holes through the plating for forming conductive layers on the core substrate.

Figure 28:
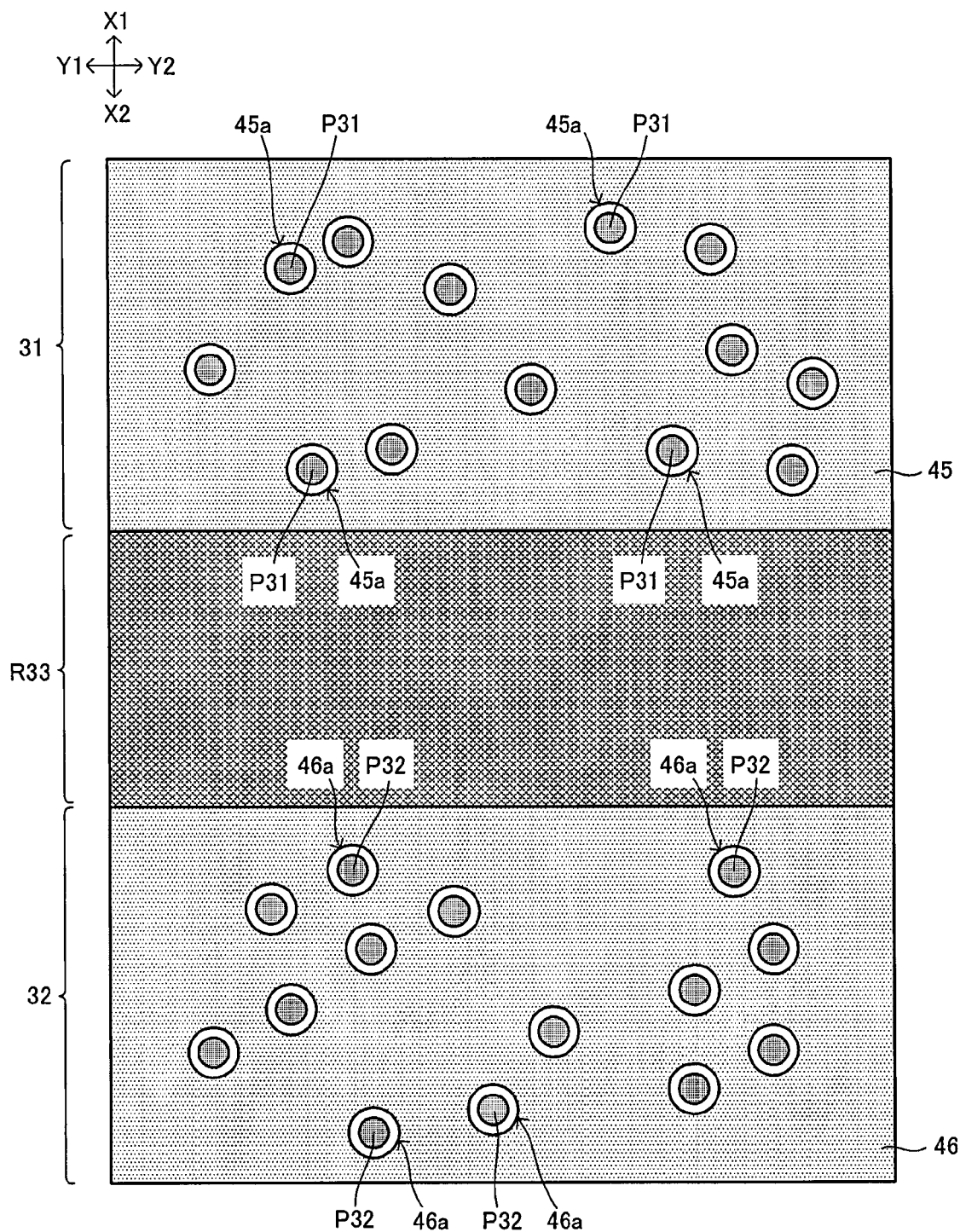
FIG. 28 is a plan view when an adhesive sheet is positioned on a first multilayer wiring board according to the second embodiment of the present invention.

Adhesive sheets (45, 46) are prepared to adhere wiring boards (30~50). Adhesive sheets (45, 46) are approximately the same size as wiring boards (40, 50), and multiple penetrating holes (45a, 46a) with a hole diameter larger than pads are formed in positions corresponding to pads as shown in FIG. 28. Penetrating holes (45a, 46a) may be formed the same as penetrating holes (45a) in adhesive sheet 45 in the first embodiment (see FIGS. 7A~7C).

Wiring board 40 is connected to rigid section 31 of wiring board 30 using adhesive sheet 45, and wiring board 50 is connected to rigid section 32 of wiring board 30 using adhesive sheet 46. In the present embodiment, connecting wiring board 40 to wiring board 30 is conducted at the same time as connecting wiring board 50.

Specifically, wiring boards (30, 40) and adhesive sheet 45 are placed in such a way that pad (P31) of wiring board 30 and pad (P4) of wiring board 40 are positioned at penetrating hole (45a) in adhesive sheet 45 (see FIG. 28), and wiring boards (30, 50) and adhesive sheet 46 are placed in such a way that pad (P32) of wiring board 30 and pad (P5) of wiring board 50 are positioned at penetrating hole (46a) in adhesive sheet 46 (see FIG. 28). At this stage, adhesive sheets (45, 46) are still uncured.

Figure 29:
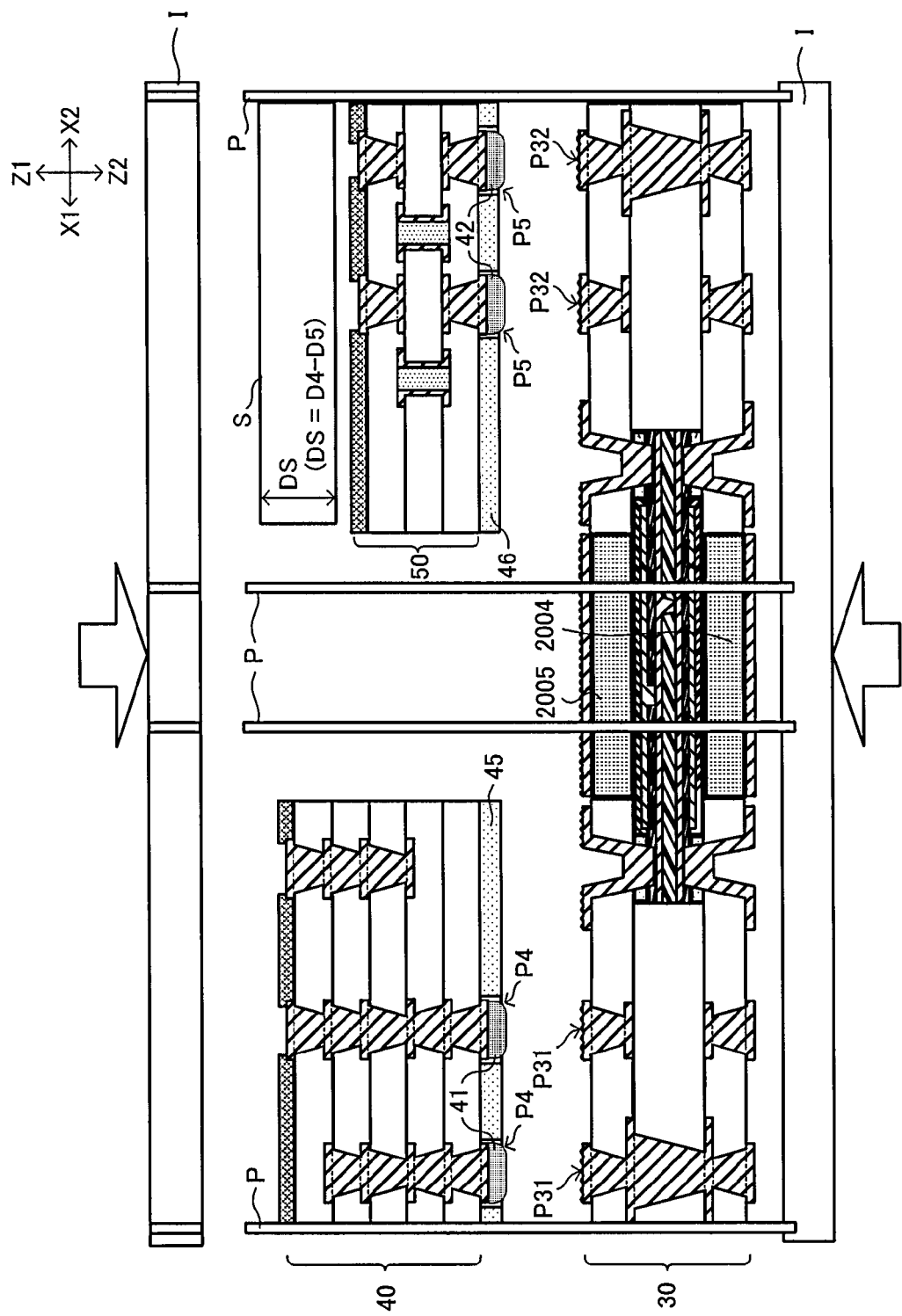
FIG. 29 is a view illustrating a step for pressing a wiring board in the method for manufacturing a wiring board according to the embodiment of the present invention.

As shown in FIG. 29, support board (S) with thickness (DS) which corresponds to the difference between thickness (D4) of wiring board 40 and thickness (D5) of wiring board 50 is placed on the upper side of wiring board 30, and pressure is added in a direction that moves wiring board 30 and wiring boards (40, 50) to be closer to each other. Such pressing is hot pressing, for example, the same as in the first embodiment.

In the present embodiment, thickness (D5) of wiring board 50 is smaller than thickness (D4) of wiring board 40. Then, support board (S) with thickness (DS) corresponding to the thickness difference is placed on wiring board 50 and pressed. Thus, it is easier to evenly pressurize wiring boards (40, 50). As a result, it is easier to enhance connection reliability between wiring board 30 and wiring boards (40, 50).

Figure 30:
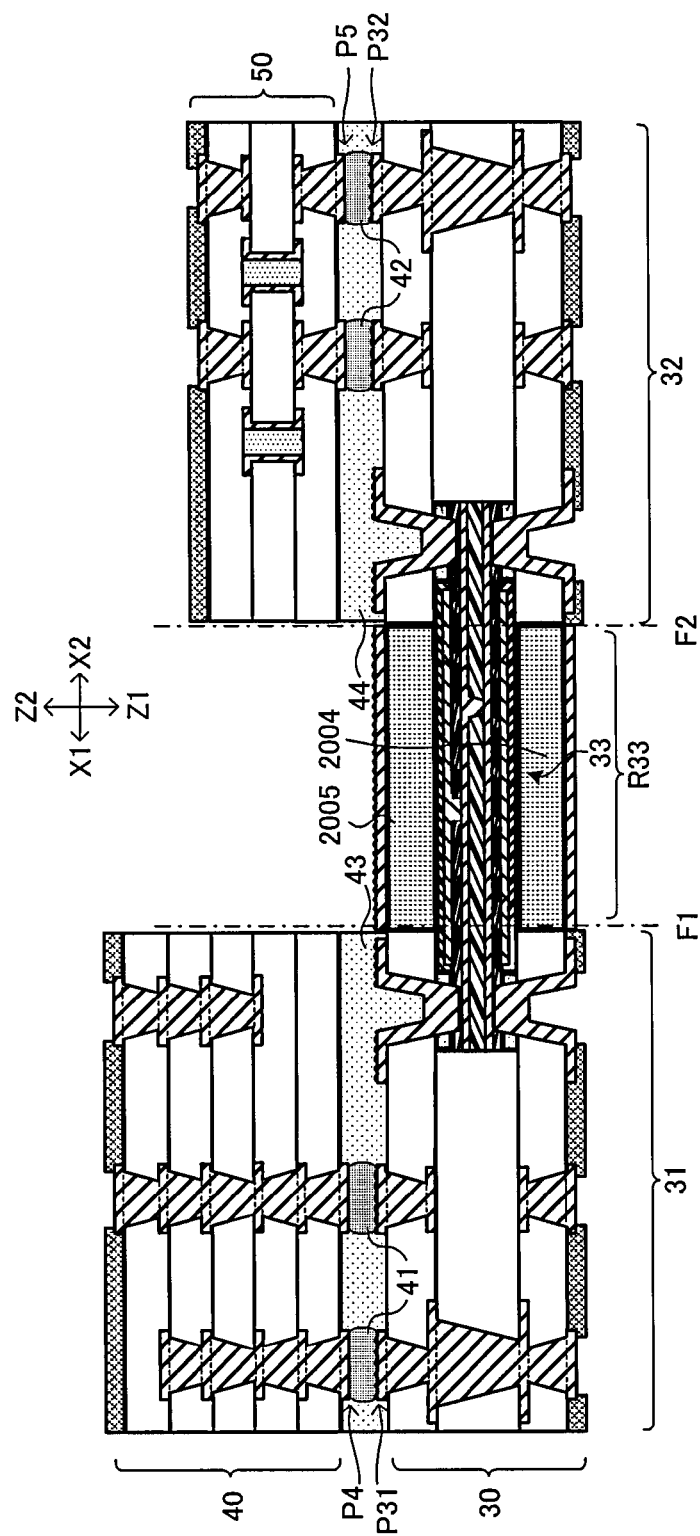
FIG. 30 is a view illustrating a second step subsequent to the step in FIG. 29.

According to the above connection, wiring boards (30, 40) are connected so that pad (P31) of wiring board 30 faces pad (P4) of wiring board 40, and wiring boards (30, 50) are connected so that pad (P32) of wiring board 30 faces pad (P5) of wiring board 50 as shown in FIG. 30.

Then, portions where strip masks (2004, 2005) are positioned are removed from wiring board 30. Accordingly, the central portion of flexible wiring board 33 is exposed, and space is formed on the upper and lower portions of flexible wiring board 33 (in lamination directions of insulation layers) to allow flexible wiring board 33 to warp (bend). As a result, wiring board 2 (FIG. 12) is completed. As described, since wiring boards (40, 50) are adhered to wiring board 30 while strip masks (2004, 2005) are still positioned in the present embodiment, wiring boards (40, 50) are easily mounted on wiring board 30 without causing flexible wiring board 33 to warp.

In wiring board 2 of the present embodiment, wiring boards (40, 50) are connected through adhesive-sheet layers (43, 44) to wiring board 30 which has flexible wiring board 33. Unlike such situations in which multiple insulation layers and conductive layers are laminated on wiring board 30 and then the portion corresponding to flexible wiring board 33 is removed, it is not required to remove the region between wiring boards (40, 50) in the present embodiment. Therefore, wiring board 2 is manufactured with fewer materials, while wiring board 2 is manufactured in a shorter duration.

In wiring board 2 of the second embodiment, wiring board 40 is connected to rigid section 31 of wiring board 30, and wiring board 50 is connected to rigid section 32 of wiring board 30. However, either wiring board 40 or 50 or both of them may be connected only to either rigid section of wiring board 30 (for example, only to rigid section 31).

The present embodiment is not limited to the above embodiments. For example, the present embodiment may be modified as follows.

Figure 31:
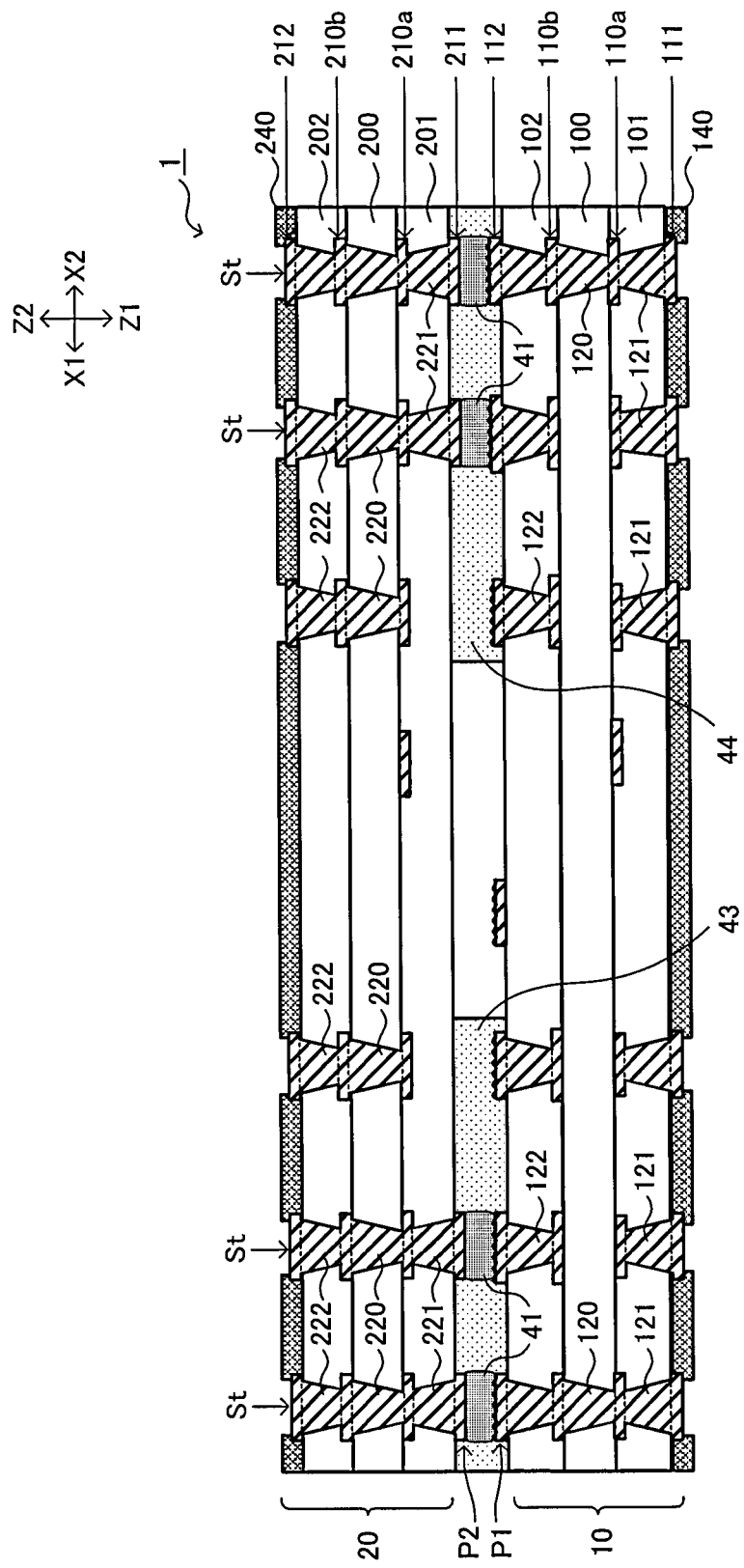
FIG. 31, in yet another embodiment of the present invention, is a view showing an example in which first and second multilayer wiring boards are connected through multiple adhesive-sheet layers.

As shown in FIG. 31, wiring board 10 and wiring board 20 may be connected through multiple adhesive-sheet layers (43, 44). In the example shown in FIG. 31, there is space between two adhesive-sheet layers (43, 44).

Figure 32:
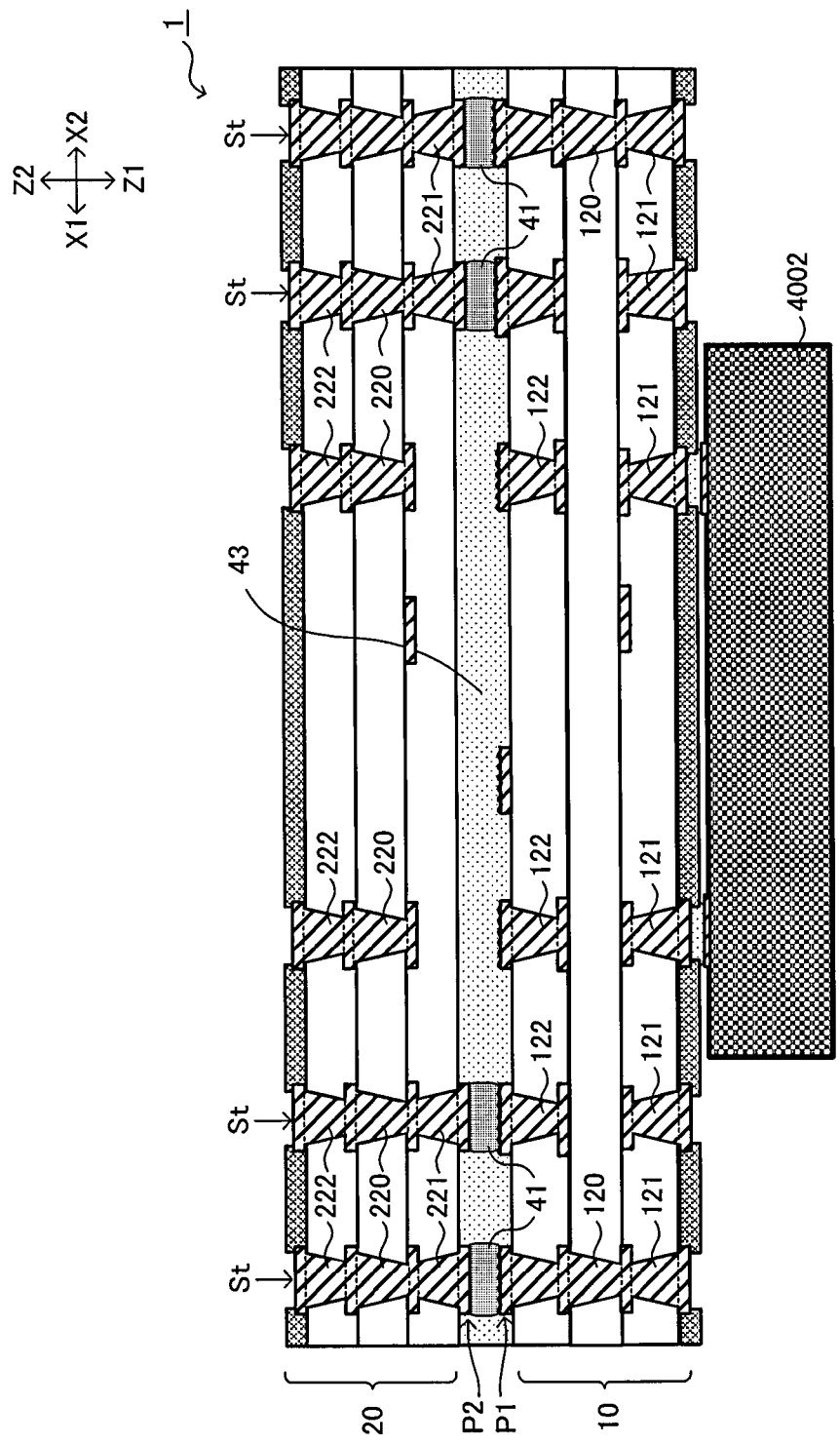
FIG. 32, in yet another embodiment of the present invention, is a view showing an example in which an electronic component is surface mounted on a wiring board.

Another wiring board, an electronic component or the like may be mounted on first surfaces of wiring boards (1, 2). For example, as shown in FIG. 32, electronic component 4002 may be mounted on the first surface of wiring board 1. The type of electronic component 4002 is not limited specifically. For example, any electronic component, for example, passive components such as a capacitor, resistor or coil in addition to active components such as an IC circuit, may be selected freely.

Figure 33:
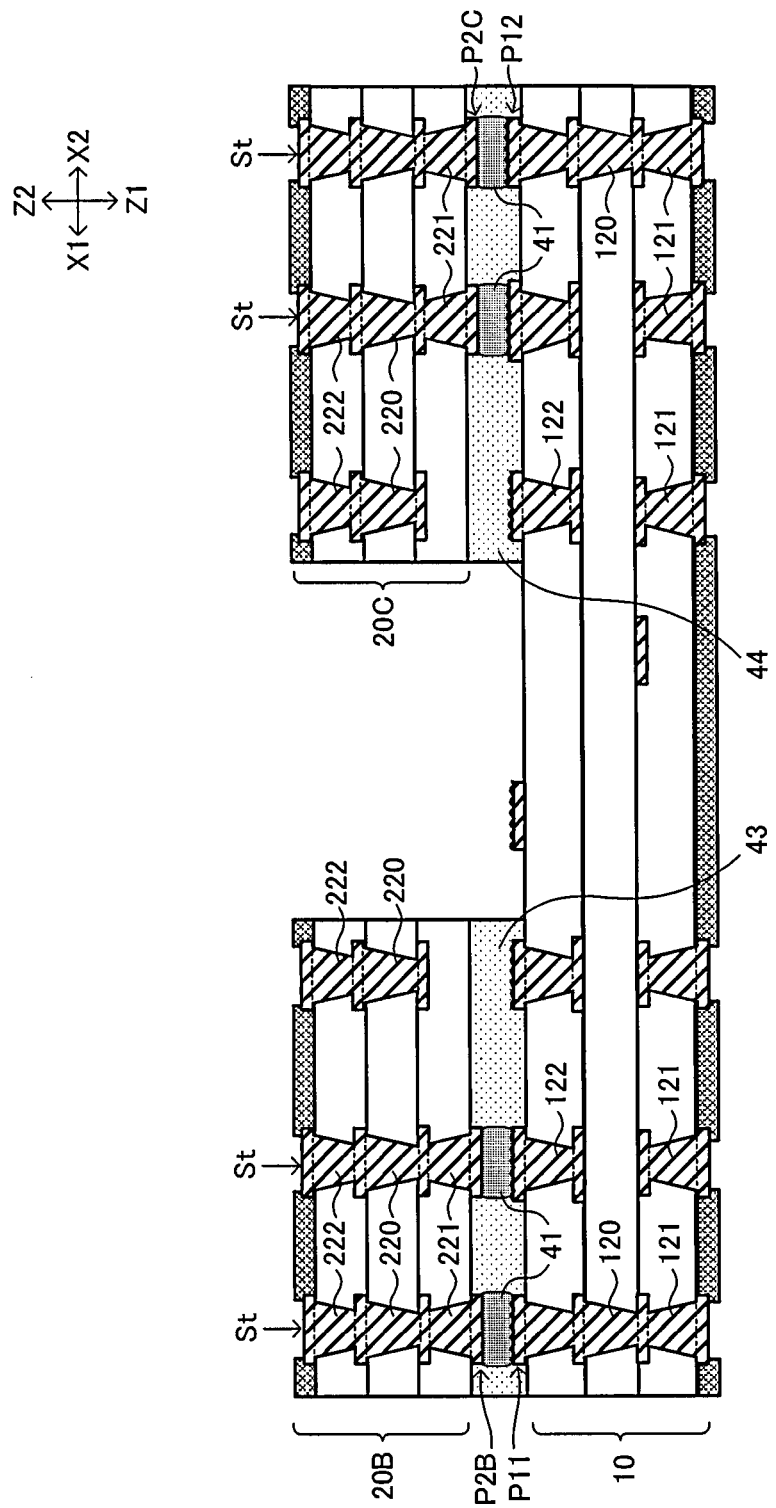
FIG. 33, in yet another embodiment of the present invention, is a view showing an example in which second and third multilayer wiring boards are mounted on one surface of a first multilayer wiring board.
Figure 34:
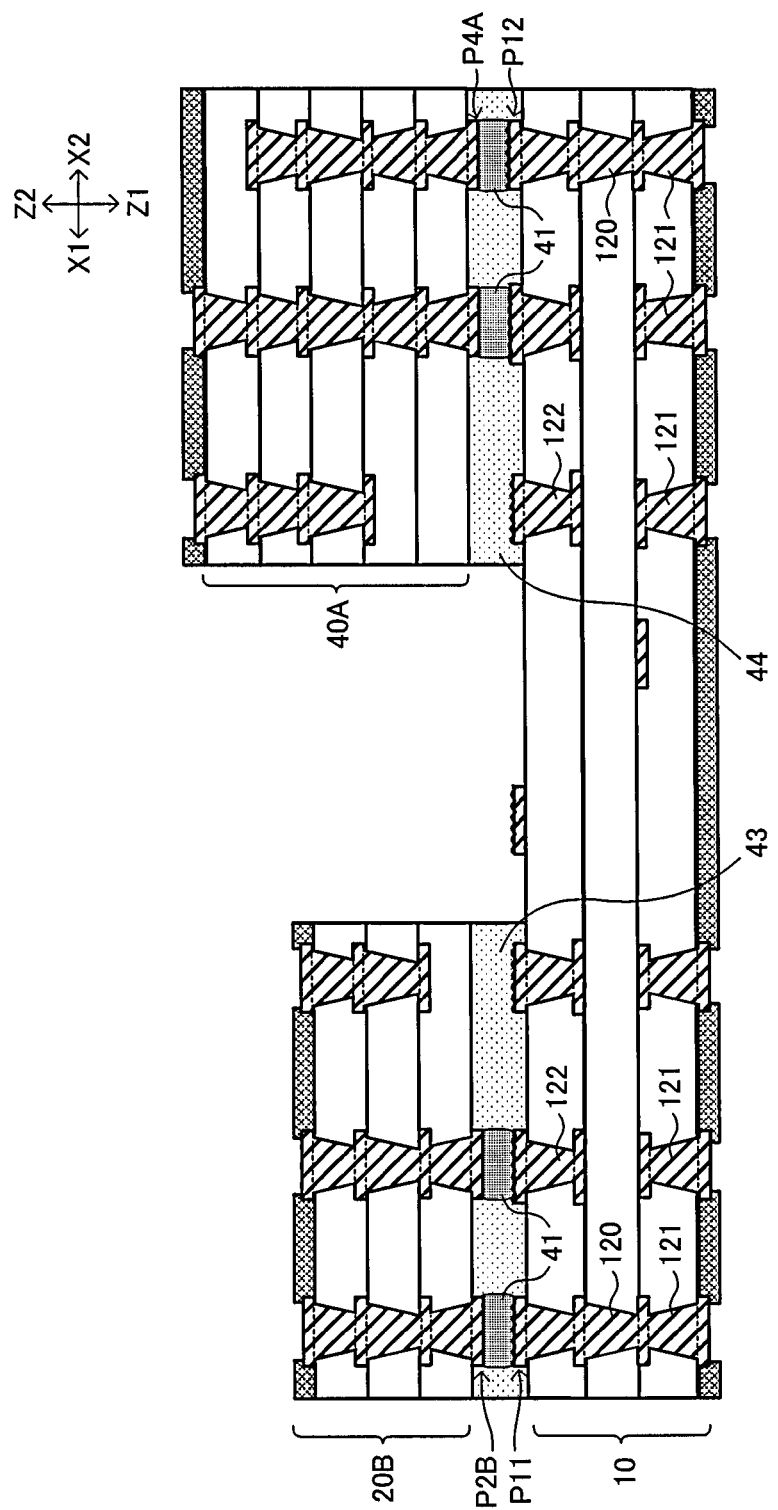
FIG. 34, in yet another embodiment of the present invention, is a view showing an example in which second and third multilayer wiring boards with different numbers of layers are mounted on one surface of a first multilayer wiring board.
Figure 35:
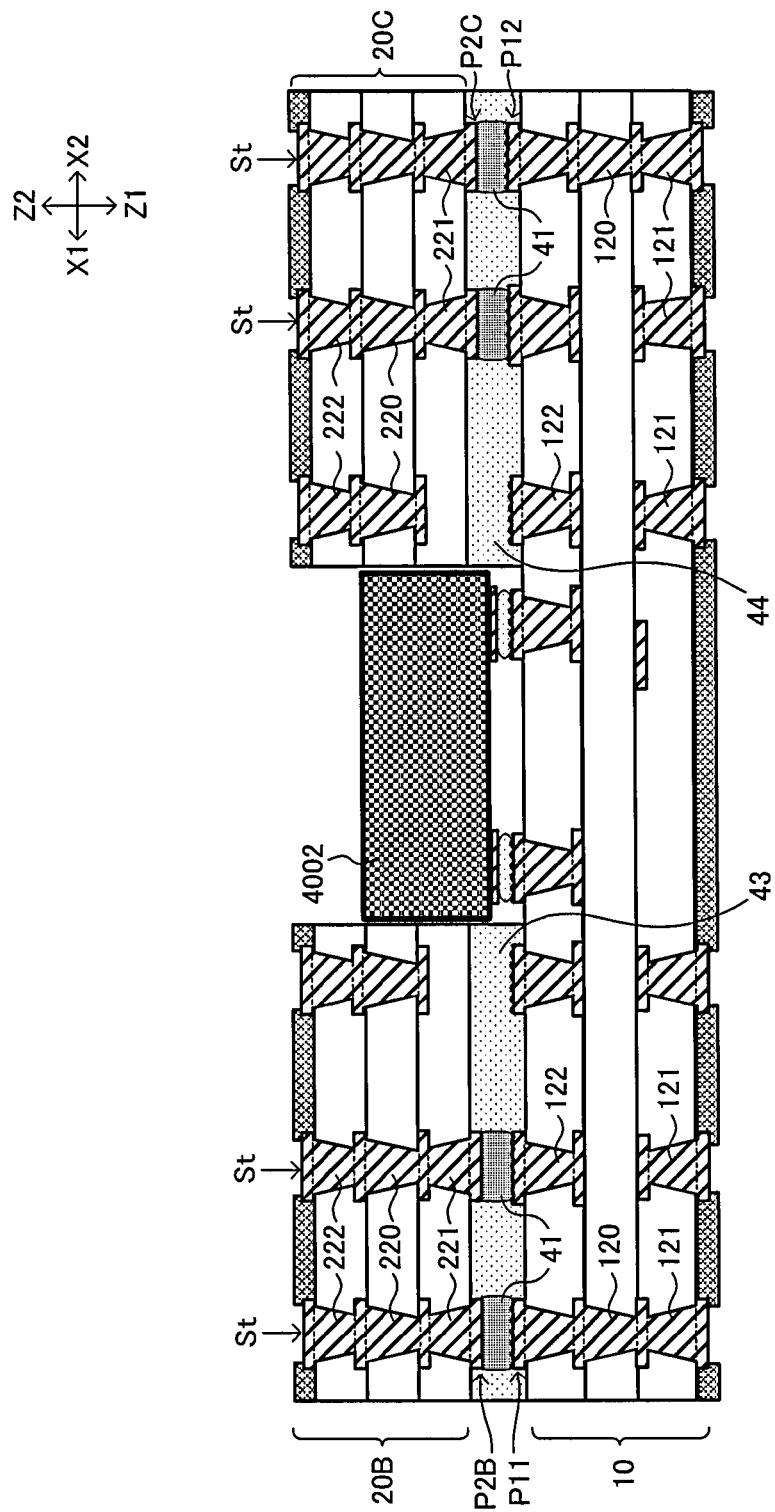
FIG. 35 is a view showing an example in which an electronic component is mounted between the second multilayer wiring board and the third multilayer wiring board in the example shown in FIG. 33.

As shown in FIG. 33, multiple wiring boards (20B, 20C) having substantially the same structure as wiring board 20 may be connected through adhesive-sheet layers (43, 44) on one side of wiring board 10. In such a case, wiring board (20B) and wiring board (40A) connected to wiring board 10 may have different numbers of layers as shown in FIG. 34. Wiring board (40A) may be structured substantially the same as wiring board 40, for example. By connecting multiple wiring boards (20B, 20C, 40A) to wiring board 10, when wiring density varies significantly in wiring board 1, only the portions with higher density are manufactured as wiring boards (20B, 20C, 40A) and attached to wiring board 10 so that wiring board 1 is manufactured in a shorter duration. Also, compared with such wiring board 1 that has an insulation layer formed in a portion where no wiring is required, wiring board 1 can be manufactured with fewer materials. In addition, electronic component 4002 may be mounted in the space between wiring boards connected to wiring board 10 (the space between wiring board (20B) and wiring board (20C)) as shown in FIG. 35.

Figure 36:
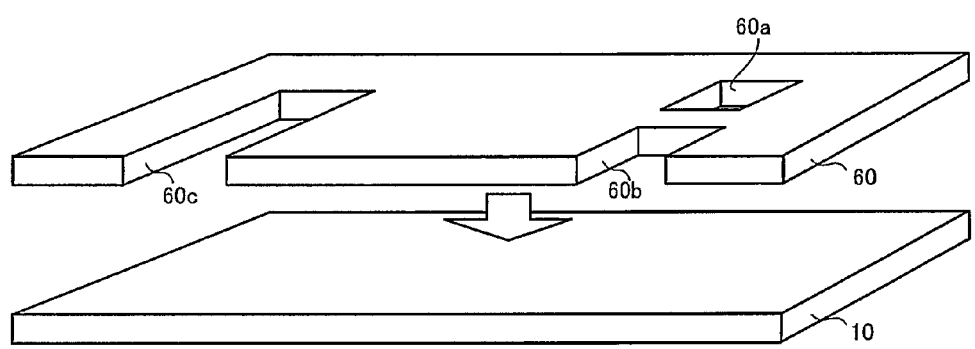
FIG. 36, in yet another embodiment of the present invention, is a view showing an example in which a second multilayer wiring board having openings and notches is laminated on one surface of a first multilayer wiring board.

As shown in FIG. 36, a wiring board may be obtained when wiring board 60 having opening (60a) and notches (60b, 60c) is connected to wiring board 10 through an adhesive-sheet layer (not shown in the drawing) in such a way that their pads (not shown in the drawing) face each other. At that time, by forming connection terminals to be connected to electronic component 4002, for example, in positions of wiring board 10 corresponding to opening (60a) and notches (60b, 60c) of wiring board 60, it is easy to manufacture a wiring board having a cavity for mounting electronic component 4002 or the like.

Figure 37:
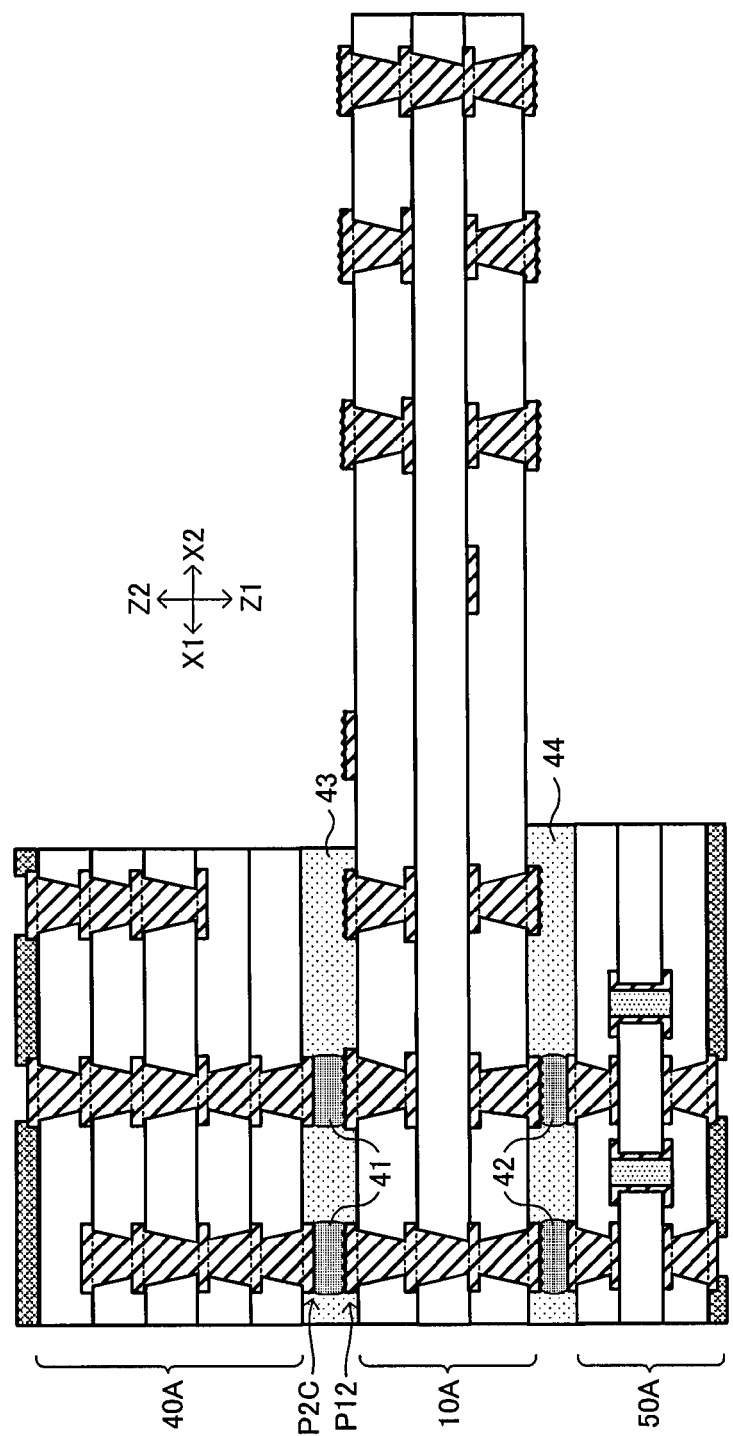
FIG. 37, in yet another embodiment of the present invention, is a view showing an example in which a second multilayer wiring board is connected on one surface of a first multilayer wiring board and a third multilayer wiring board is connected to the other surface of the first multilayer wiring board.

As shown in FIG. 37, wiring board (40A) with substantially the same structure as wiring board 40 may be connected to one surface of wiring board 10, while wiring board (50A) with substantially the same structure as wiring board 50 is connected to the other surface of wiring board 10. The positions of wiring boards (40A, 50A) and wiring board 10 may be selected appropriately.

Figure 38:
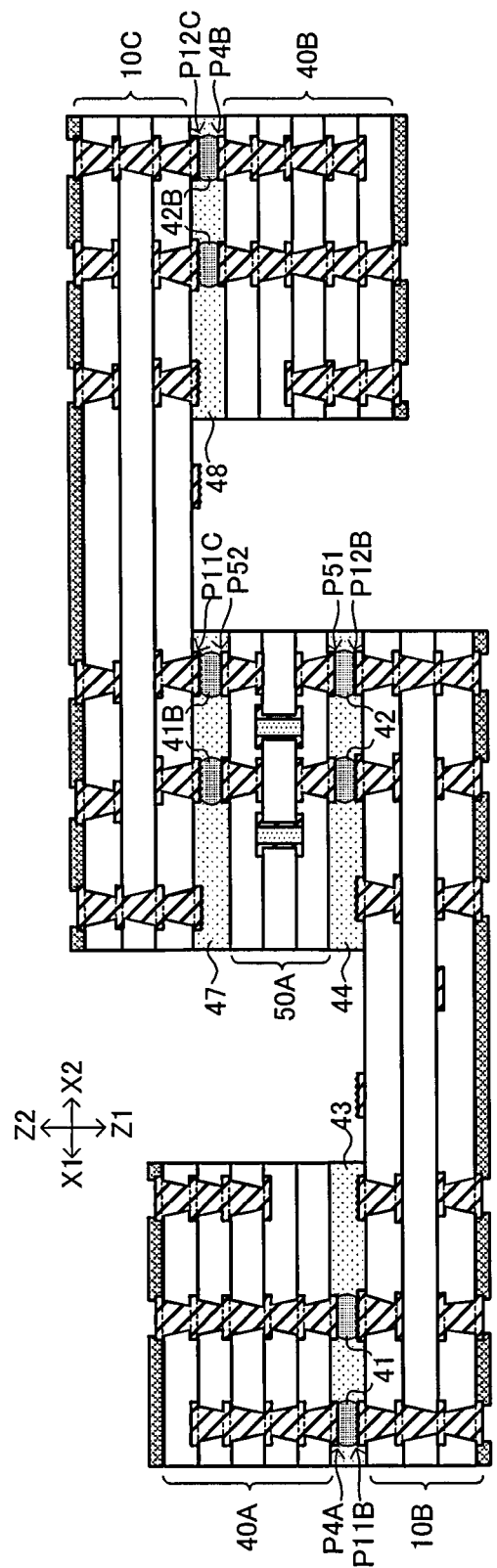
FIG. 38, in yet another embodiment of the present invention, is a view showing an example in which a second multilayer wiring board and a third multilayer wiring board are mounted in such a way that either one is shared by multiple first multilayer wiring boards.

As shown in FIG. 38, a wiring board (wiring board (50A), for example, with substantially the same structure as wiring board 50) may be mounted to be shared by two wiring boards (10B, 10C) with substantially the same structure as wiring board 10 shown in FIG. 1. In the example shown in FIG. 38, pad (P51) on one side of wiring board (50A) faces pad (P12B) of wiring board (10B), and pad (P52) on the other side of wiring board (50A) faces pad (P11C) of wiring board (10C). In the example shown in FIG. 38, wiring board (50A) is sandwiched by wiring boards (10B, 10C).

Specifically, wiring board (40A) and wiring board (50A) are each connected to a second surface of wiring board (10B). Wiring board (10B) and wiring board (40A) are adhered by adhesive-sheet layer 43 so that pad (P11B) of wiring board (10B) and pad (P4A) of wiring board (40A) are positioned to face each other. Also, wiring board (10B) and wiring board (50A) are positioned and adhered by adhesive-sheet layer 44 so that pad (P12B) of wiring board (10B) and pad (P51) of wiring board (50A) are positioned to face each other.

In addition, wiring board (50A) and wiring board (40B) are each connected to a first surface of wiring board (10C). Wiring board (10C) and wiring board (50A) are adhered by adhesive-sheet layer 47 so that pad (P11C) of wiring board (10C) and pad (P52) of wiring board (50A) are positioned to face each other. Also, wiring board (10C) and wiring board (40B) are adhered by adhesive-sheet layer 48 so that pad (P12C) of wiring board (10C) and pad (P4B) of wiring board (40B) are positioned to face each other.

Figure 39:
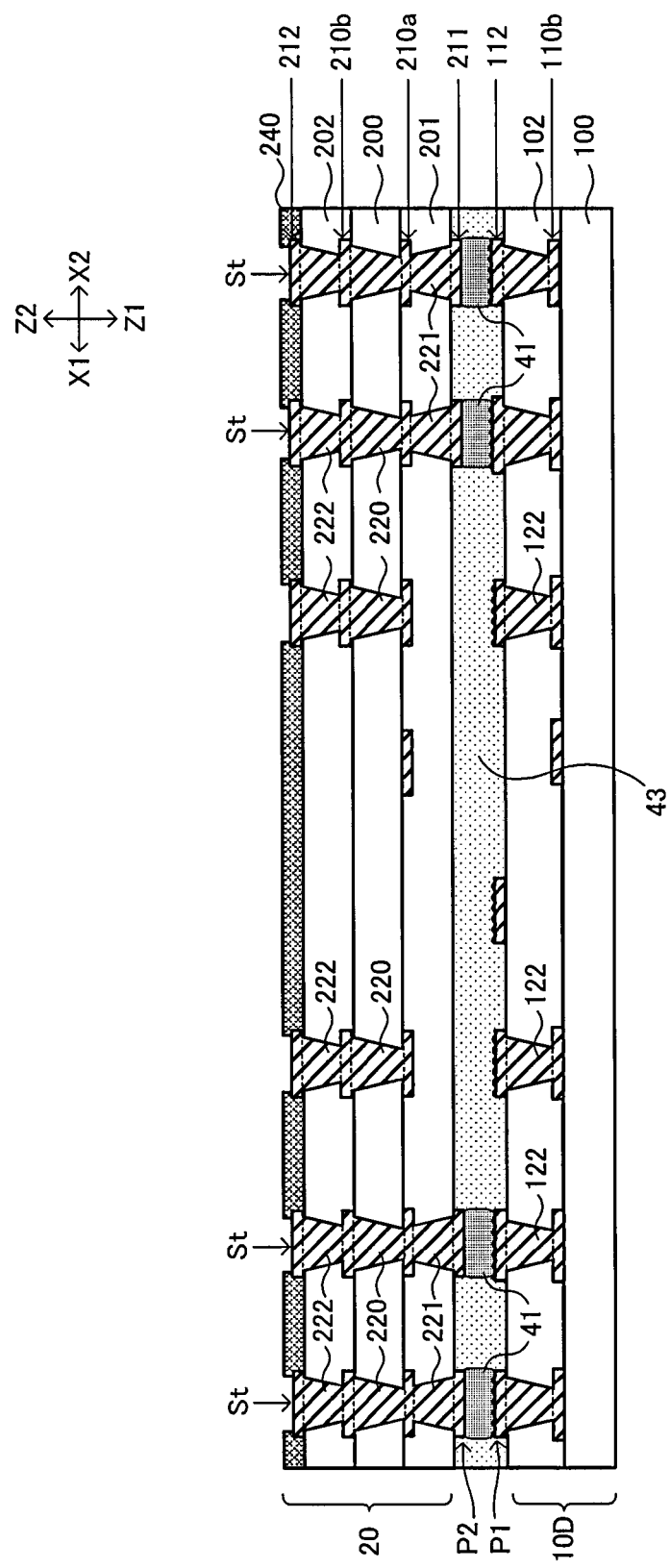
FIG. 39, in yet another embodiment of the present invention, is a view showing an example in which conductive layers are formed on one side of the core substrate.

In the above embodiments, wiring board 10 (first multilayer wiring board) is set to be a double-sided wiring board having conductive layers on both sides of substrate 100 (core substrate). However, that is not the only option. For example, as shown in FIG. 39, it may be a single-sided wiring board having conductive layers only on one side of substrate 100 (core substrate).

In the above embodiments, the number of conductive layers in wiring board 10 is the same as the number of conductive layers in wiring board 20. However, the number of conductive layers may be different as shown in FIG. 39, for example. The number of conductive layers in wiring boards (10, 20) is determined freely. Also, the number of conductive layers in wiring boards 30~50 is not limited specifically.

Figure 40:
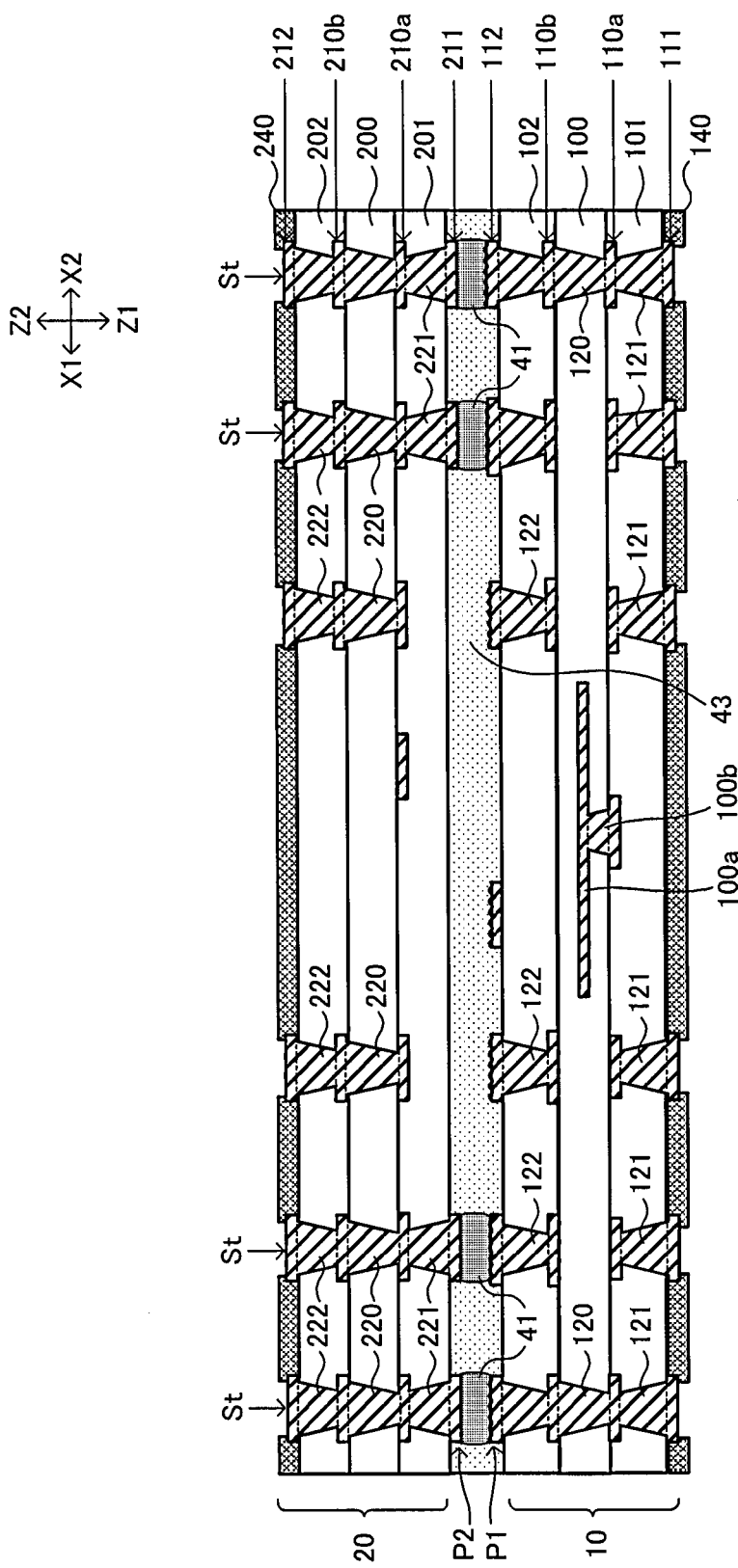
FIG. 40, in yet another embodiment of the present invention, is a view showing an example in which a first multilayer wiring board includes a built-in metal sheet.

Substrate 100 (core substrate) of wiring board 10 (first multilayer wiring board) may have built-in metal sheet (100a) (such as copper foil) as shown in FIG. 40. In such substrate 100, heat radiation is enhanced by metal sheet (100a). In the example shown in FIG. 40, via conductor (100b) reaching metal sheet (100a) is formed in substrate 100, and metal sheet (100a) and a ground line (conductive pattern included in conductive layer (110b)) are electrically connected to each other by via conductor (100b). The planar shape of metal sheet (100a) is determined freely. For example, it may be rectangular or circular.

Figure 41:
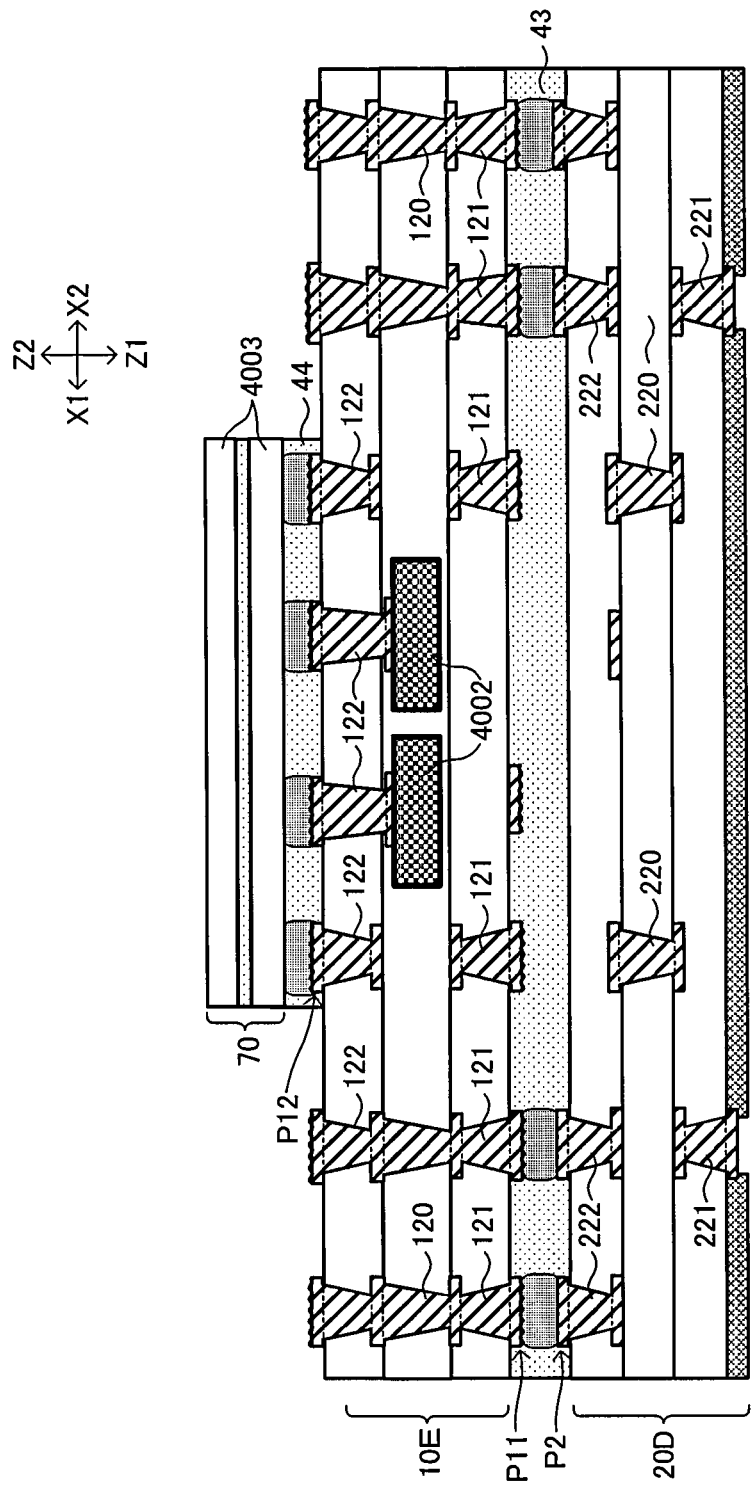
FIG. 41, in yet another embodiment of the present invention, is a view showing an example in which a second multilayer wiring board is connected to a first multilayer wiring board that has a built-in electronic component.

As shown in FIG. 41, other wiring boards (20, 70) (second multilayer wiring boards) may be connected through adhesive-sheet layers (43, 44) to wiring board (10E) (first multilayer wiring board) with built-in electronic component 4002. The type of electronic component 4002 is not limited specifically. Any electronic component, for example, passive components such as a capacitor, resistor or coil in addition to active components such as an IC circuit, may be selected. In the example shown in FIG. 41, electronic component 4002 is built into the substrate of wiring board (10E). Via 122 is electrically connected to electronic component 4002, and pad (P12) is formed on via 122. Then, wiring board (10E) and wiring board 70 are connected through adhesive-sheet layer 44 so that pad (P12) is positioned to face a pad (not shown in the drawing) of wiring board 70. In the example shown in FIG. 41, wiring board 70 is formed with two semiconductor chips 4003 connected by an adhesive agent. According to such a structure, wiring length is reduced between semiconductor chips 4003 of wiring board 70 and electronic component 4002 of wiring board (10E).

Figure 42:
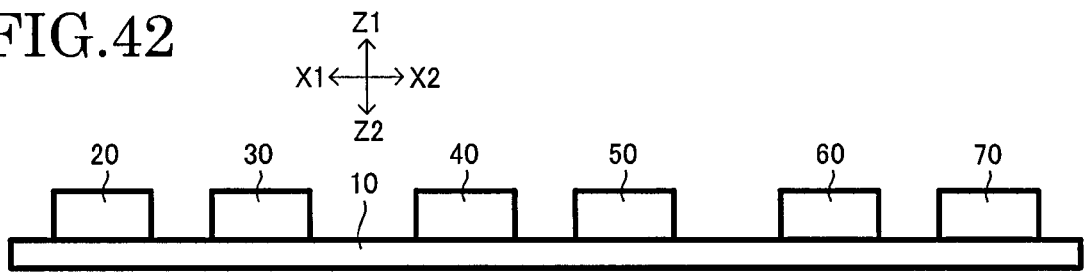
FIG. 42, in yet another embodiment of the present invention, is a view showing an example in which three or more multilayer wiring boards are mounted on a first multilayer wiring board.

As shown in FIG. 42, three or more wiring boards (such as wiring boards 20~70) may be mounted on wiring board 10. Here, the method for mounting each wiring board is the same as those in the above embodiments, for example. Wiring boards 20~70 have different numbers of conductive layers from each other, for example.

Regarding other elements, structures of wiring boards (10~70, 10A~10C, 40A, 40B, 50A) and the type, quality, dimensions, material, shape, number of layers, positioning and the like of their structural elements may be modified freely within a scope that does not deviate from the gist of the present invention.

The contents and the order of manufacturing methods of the above embodiments may be modified freely within a scope that does not deviate from the gist of the present invention. In addition, some steps may be omitted depending on usage or the like. For example, instead of forming bonding layers (41, 42) on pad (P2) of wiring board 20 and pads (P4, P5) of wiring boards (40, 50), bonding layers (41, 42) may be formed on pad (P1) of wiring board 10 and pads (P31, P32) of wiring board 30. Also, instead of or in addition to conducting a roughening treatment on surfaces of conductive layer 112 of wiring board 10 and conductive layer 312 of wiring board 30, a roughening treatment may be conducted on surfaces of conductive layer 211 of wiring board 20 and conductive layers (413, 511) of wiring boards (40, 50).

Figure 43:
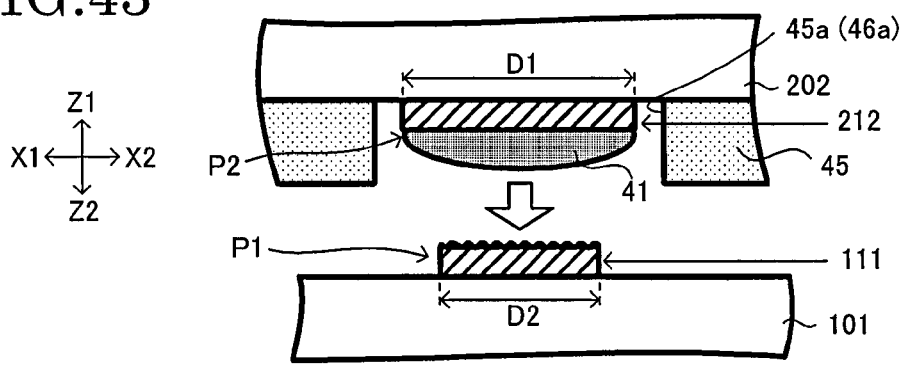
FIG. 43, in yet another embodiment of the present invention, is a view showing an example in which one pad is made smaller than the other pad.

As shown in FIG. 43, compared with a pad of the conductive layer where only pads are formed, the area of a pad of the conductive layer where pads and other wiring are formed may be set smaller. In the example shown in FIG. 43, compared with pad (P2) of wiring board 20 where only pads are formed, the area of pad (P1) of wiring board 10 where pads and other wiring are formed is made smaller. In such a case, it is preferred that diameter (D1) of pad (P1) relative to diameter (D2) of pad (P2) satisfy the relationship of the formula: $0.5<(D1/D2)<0.9$. If such a formula is satisfied, the wiring patterns of conductive layer 112 in wiring board 10 are set to be dense when pads (P1) and other wiring are formed.

Figure 44:
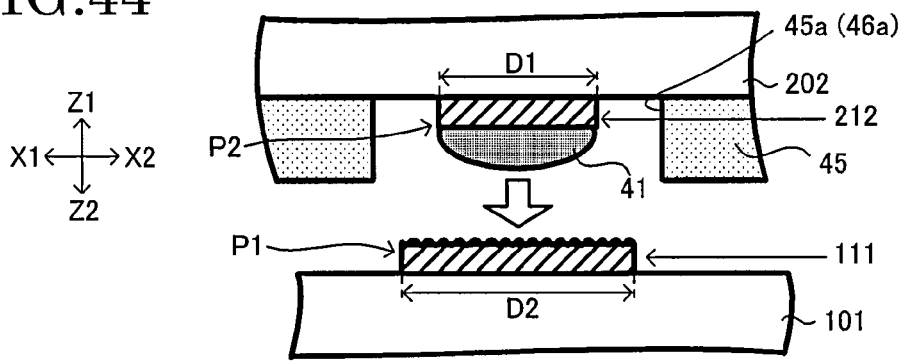
FIG. 44, in yet another embodiment of the present invention, is a view showing an example in which one pad is made larger than the other pad.

Also, compared with a pad of the conductive layer where only pads are formed, the area of a pad of the conductive layer where pads and other wiring are formed may be set larger as shown in FIG. 44. In the example shown in FIG. 44, compared with pad (P2) of wiring board 20 where only pads are formed, the area of pad (P1) of wiring board 10 where pads and other wiring are formed is made larger. In such a case, it is preferred that diameter (D1) of pad (P1) relative to diameter (D2) of pad (P2) satisfy, for example, the relationship of the formula: $0.5<(D2/D1)<0.9$. If such a formula is satisfied, it is easy to align bonding layer 41 formed on pad (P2) with pad (P1). In addition, bonding layer 41 is suppressed from being squeezed out from pad (P2) during the pressing process.

In the above embodiments, pads (P1) and other wiring are formed in conductive layer 112 of wiring board 10 and only pads (P2) are formed in conductive layer 211 of wiring board 20. It is also an option to design conductive layer 112 of wiring board 10 and conductive layer 211 of wiring board 20 so that only pads (P1) and pads (P2) face each other and that other wirings excluding pads (P1, P2) do not face each other. In doing so, connection errors of conductive layers (112, 211) are suppressed.

A wiring board according to an embodiment of the present invention has the following: a first multilayer wiring board having multiple first conductive layers and a first pad on one surface; a second multilayer wiring board having multiple second conductive layers and a second pad formed on one surface; and an adhesive sheet which adheres the first multilayer wiring board and the second multilayer wiring board in such a way that the first pad faces the second pad.

A method for manufacturing a wiring board according to another embodiment of the present invention includes the following: preparing a first multilayer wiring board having multiple first conductive layers and a first pad on one surface and a second multilayer wiring board having multiple second conductive layers and a second pad on one surface; preparing an adhesive sheet; and setting the first pad and the second pad to face each other and adhering the first multilayer wiring board and the second multilayer wiring board using the adhesive sheet.

Obviously, numerous modifications and variations of the present invention are possible in light of the above teachings. It is therefore to be understood that within the scope of the appended claims, the invention may be practiced otherwise than as specifically described herein.

What is claimed is:
1. A wiring board, comprising:
a first multilayer wiring board comprising a plurality of first conductive layers and having a surface;
a second multilayer wiring board having a plurality of second conductive layers and positioned such that the second multilayer wiring board has a surface facing the surface of the first multilayer wiring board; and
an adhesive layer comprising an adhesive sheet and interposed between the first multilayer wiring board and the second multilayer wiring board such that the adhesive layer is adhering the first multilayer wiring board and the second multilayer wiring board,
wherein the first multilayer wiring board has a first pad on the surface of the first multilayer wiring board, the second multilayer wiring board has a second pad on the surface of the second multilayer wiring board, the first pad and the second pad are positioned such that the first pad and the second pad face each other across the adhesive layer, the adhesive layer has a penetrating hole connecting the first pad and the second pad and having a hole diameter which is set greater than the first pad and the second pad such that the penetrating hole has a clearance between the first pad and the penetrating hole and a clearance between the second pad and the penetrating hole, the clearance between the penetrating hole and the first pad is filled with resin, and the clearance between the penetrating hole and the second pad is filled with resin.

2. The wiring board according to claim 1, wherein the plurality of first conductive layers of the first multilayer wiring board includes a first conductive layer formed on the surface of the first multilayer wiring board and including the first pad, the plurality of second conductive layers of the second multilayer wiring board includes a second conductive layer formed on the surface of the second multilayer wiring board and including the second pad, and the first conductive layer and the second conductive layer comprise wirings which do not face each other, excluding the first pad and the second pad.

3. The wiring board according to claim 1, wherein the plurality of first conductive layers of the first multilayer wiring board includes a first conductive layer formed on the surface of the first multilayer wiring board, the first conductive layer has a plurality of wiring portions and includes the first pad, the plurality of second conductive layers of the second multilayer wiring board includes a second conductive layer formed on the surface of the second multilayer wiring board and consisting of the second pad, and the first pad is set to have a smaller area than the second pad.

4. The wiring board according to claim 1, wherein the plurality of first conductive layers of the first multilayer wiring board includes a first conductive layer formed on the surface of the first multilayer wiring board, the first conductive layer has a plurality of wiring portions and includes the first pad, the plurality of second conductive layers of the second multilayer wiring board includes a second conductive layer formed on the surface of the second multilayer wiring board and consisting of the second pad, and the first pad is set to have a greater area than the second pad.

5. The wiring board according to claim 1, wherein at least one of the first multilayer wiring board and the second multilayer wiring board includes a plurality of filled via conductors comprising plated materials connecting at least one of the plurality of first conductive layers and the plurality of second conductive layers, respectively.

6. The wiring board according to claim 5, wherein at least one of the first pad and the second pad is positioned such that one of the filled via conductors is in contact with at least one of the first pad and the second pad.

7. The wiring board according to claim 6, wherein the filled via conductors are formed in truncated cone shapes tapering in a lamination direction of the at least one of the first multilayer wiring board and the second multilayer wiring board, and the at least one of the first pad and the second pad is formed to make contact with a surface of the one of the filled via conductors in contact such that the surface of the one of the filled via conductors in contact is a surface having a larger diameter of a truncated cone shape.

8. The wiring board according to claim 1, wherein at least one of the first multilayer wiring board and the second multilayer wiring board includes a plurality of via conductors connecting at least one of the plurality of first conductive layers and the plurality of second conductive layers, and the plurality of via conductors reverses a tapering direction more than twice.

9. The wiring board according to claim 1, wherein at least one of the first pad and the second pad has a tin-plated layer formed on a surface of the at least one of the first pad and the second pad.

10. The wiring board according to claim 1, wherein the second multilayer wiring board and the adhesive layer have substantially a same size.

11. The wiring board according to claim 1, wherein the first multilayer wiring board comprises a first core substrate and a plurality of first insulation layers laminated on the first core substrate, the second multilayer wiring board comprises a second core substrate and a plurality of second insulation layers laminated on the second core substrate, and the first insulation layers, the second insulation layers and the adhesive sheet of the adhesive layer are made of a same material.

12. The wiring board according to claim 1, further comprising:
a third multilayer wiring board comprising a plurality of third conductive layers and positioned such that the third multilayer wiring board has a surface facing a second surface of the first multilayer wiring board; and
a second adhesive layer comprising an adhesive sheet and interposed between the first multilayer wiring board and the third multilayer wiring board such that the second adhesive layer is adhering the first multilayer wiring board and the third multilayer wiring board,
wherein the third multilayer wiring board has a third pad formed on the surface of the third multilayer wiring board such that the third pad faces a pad on the second surface of the first multilayer wiring board across the second adhesive layer interposed between the first multilayer wiring board and the third multilayer wiring board.

13. The wiring board according to claim 12, wherein the plurality of second conductive layers in the second multilayer wiring board and the plurality of third conductive layers in the third multilayer wiring board have different numbers of conductive layers.

14. The wiring board according to claim 1, wherein the first multilayer wiring board is a rigid wiring board, and the second multilayer wiring board is a rigid wiring board.

15. The wiring board according to claim 1, wherein the first multilayer wiring board is a flex-rigid wiring board comprising a plurality of rigid wiring boards and a flexible wiring board connecting the rigid wiring boards.

16. The wiring board according to claim 1, wherein the first multilayer wiring board has a built-in metal sheet formed in the first multilayer wiring board.

17. The wiring board according to claim 1, wherein the resin filling the clearance between the penetrating hole and the clearance between the penetrating hole and the second pad is derived from the adhesive layer.

18. The wiring board according to claim 1, further comprising a bonding layer connecting the first pad and the second pad in the penetrating hole.

19. A method for manufacturing a wiring board, comprising:
preparing a first multilayer wiring board comprising a plurality of first conductive layers and having a first pad on a surface of the first multilayer wiring board;
preparing a second multilayer wiring board comprising a plurality of second conductive layers and having a second pad on a surface of the second multilayer wiring board;
setting the surface of the first multilayer wiring board and the surface of the second multilayer wiring board such that the first pad and the second pad face each other;
forming a penetrating hole in an adhesive layer comprising an adhesive sheet such that the penetrating hole has a hole diameter which is made greater than diameters of the first and second pads such that the penetrating hole has a clearance between the first pad and the penetrating hole and a clearance between the second pad and the penetrating hole; and interposing the adhesive layer between the surface of the first multilayer wiring board and the surface of the second multilayer wiring board such that the first multilayer wiring board and the second multilayer wiring board are adhered through the adhesive layer, that the first pad and the second pad face each other across the adhesive layer and that the penetrating hole connects the first pad and the second pad, wherein the interposing of the adhesive layer includes filling the clearance between the penetrating hole and the first pad with resin and filling the clearance between the penetrating hole and the second pad with resin.

20. The method for manufacturing the wiring board according to claim 19, wherein at least one of the first multilayer wiring board and the second multilayer wiring board comprises a plurality of filled vias comprising plated materials and having truncated cone shapes, the plurality of filled vias is formed such that the truncated cone shapes are tapering in a lamination direction of the at least one of the first multilayer wiring board and the second multilayer wiring board and connect at least one of the plurality of first conductive layers and the plurality of the second conductive layers, and the at least one of the first pad and the second pad is formed to make contact with a surface of the one of the filled via conductors in contact such that the surface of the one of the filled via conductors in contact is a surface having a larger diameter of a truncated cone shape.

21. The method for manufacturing the wiring board according to claim 19, further comprising:

preparing a third multilayer wiring board comprising a plurality of third conductive layers and having a third pad on a surface of the third multilayer wiring board;

setting a second surface of the first multilayer wiring board and the surface of the third multilayer wiring board such that the third pad and a pad on the second surface of the first multilayer wiring board to face each other; and interposing between the second surface of the first multilayer wiring board and the surface of the third multilayer wiring board a second adhesive layer comprising an adhesive sheet such that the first multilayer wiring board and the third multilayer wiring board are adhered through the second adhesive layer and that the third pad and the pad on the second surface of the first multilayer wiring board face each other across the second adhesive layer.

22. The method for manufacturing the wiring board according to claim 21, wherein the plurality of second conductive layers in the second multilayer wiring board and the plurality of third conductive layers in the third multilayer wiring board have different numbers of conductive layers.

23. The method for manufacturing the wiring board according to claim 19, wherein the resin filling the clearance between the penetrating hole and the clearance between the penetrating hole and the second pad is derived from the adhesive layer.

24. The method for manufacturing the wiring board according to claim 19, further comprising forming a bonding layer connecting the first pad and the second pad in the penetrating hole.

* * * * *